(12) United States Patent
Kim

(10) Patent No.: US 7,768,601 B2
(45) Date of Patent: Aug. 3, 2010

(54) THIN FILM TRANSISTOR ARRAY PANEL AND LIQUID CRYSTAL DISPLAY INCLUDING THE PANEL

(75) Inventor: Dong-Gyu Kim, Yongin (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 12/233,362

(22) Filed: Sep. 18, 2008

(65) Prior Publication Data

US 2009/0032818 A1 Feb. 5, 2009

Related U.S. Application Data

(63) Continuation of application No. 10/738,648, filed on Dec. 17, 2003, now Pat. No. 7,436,474.

(30) Foreign Application Priority Data

Dec. 17, 2002 (KR) ............... 2002-80812

(51) Int. Cl.
*G02F 1/1335* (2006.01)
(52) U.S. Cl. ............ 349/110; 349/111; 349/41; 349/40
(58) Field of Classification Search ............ None
See application file for complete search history.

(56) References Cited

U.S. PATENT DOCUMENTS 5,461,419 A * 10/1995 Yamada ............ 348/302
6,404,473 B1 6/2002 Kaneko et al.

| | | |
|---|---|---|
| 2001/0052951 A1 | 12/2001 | Ashizawa et al. |
| 2002/0080295 A1 | 6/2002 | Someya et al. |
| 2002/0122143 A1 | 9/2002 | Woo et al. |

FOREIGN PATENT DOCUMENTS

| | | |
|---|---|---|
| JP | 07-263700 | 10/1995 |
| JP | 09-033951 | 2/1997 |
| JP | 2000-122097 | 4/2000 |
| JP | 2000-164886 | 6/2000 |
| JP | 2000-241832 | 9/2000 |
| JP | 2001-312241 | 11/2001 |
| JP | 2003-172919 | 6/2003 |
| JP | 2003-273365 | 9/2003 |
| KR | 1020020056110 | 7/2002 |
| KR | 100471771 | 2/2005 |

* cited by examiner

*Primary Examiner*—David Nelms
*Assistant Examiner*—Lucy P Chien
(74) *Attorney, Agent, or Firm*—F. Chau & Associates LLC

(57) ABSTRACT

A gate wire including a gate line and a gate electrode is formed on an insulating substrate of a TFT array panel. A semiconductor pattern made of amorphous silicon is formed on the gate insulating layer covering the gate wire. A data wire including a data line, a source electrode, and a drain electrode is formed on the semiconductor pattern or the gate insulating layer covering the gate wire. A part of the semiconductor pattern extends under the data line, and a light blocking member overlapping the semiconductor pattern under the data line is formed using the same layer as the gate wire. The light blocking member is to prevent light incident upon the substrate from a backlight from entering the amorphous silicon layers; therefore, the stripes of different brightness and waterfall phenomenon in which the stripes move up and down can be removed in an LCD using a backlight driven by a rectangular wave of ON/OFF signals outputted from inverter.

10 Claims, 49 Drawing Sheets

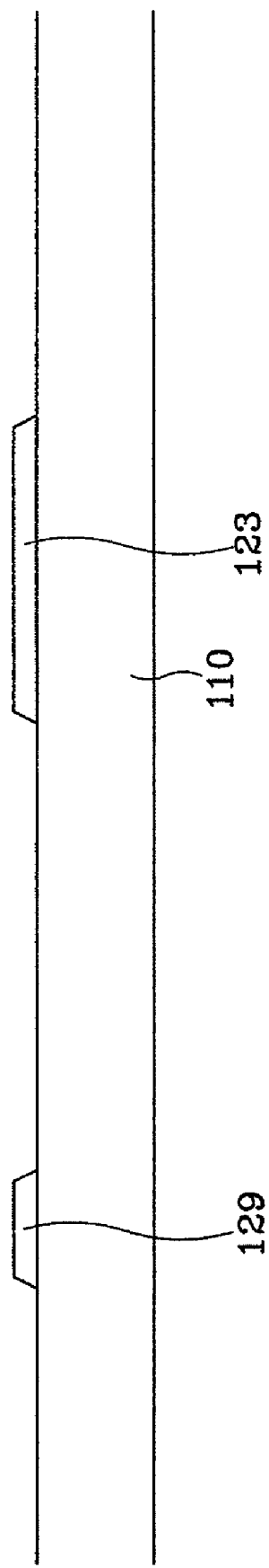

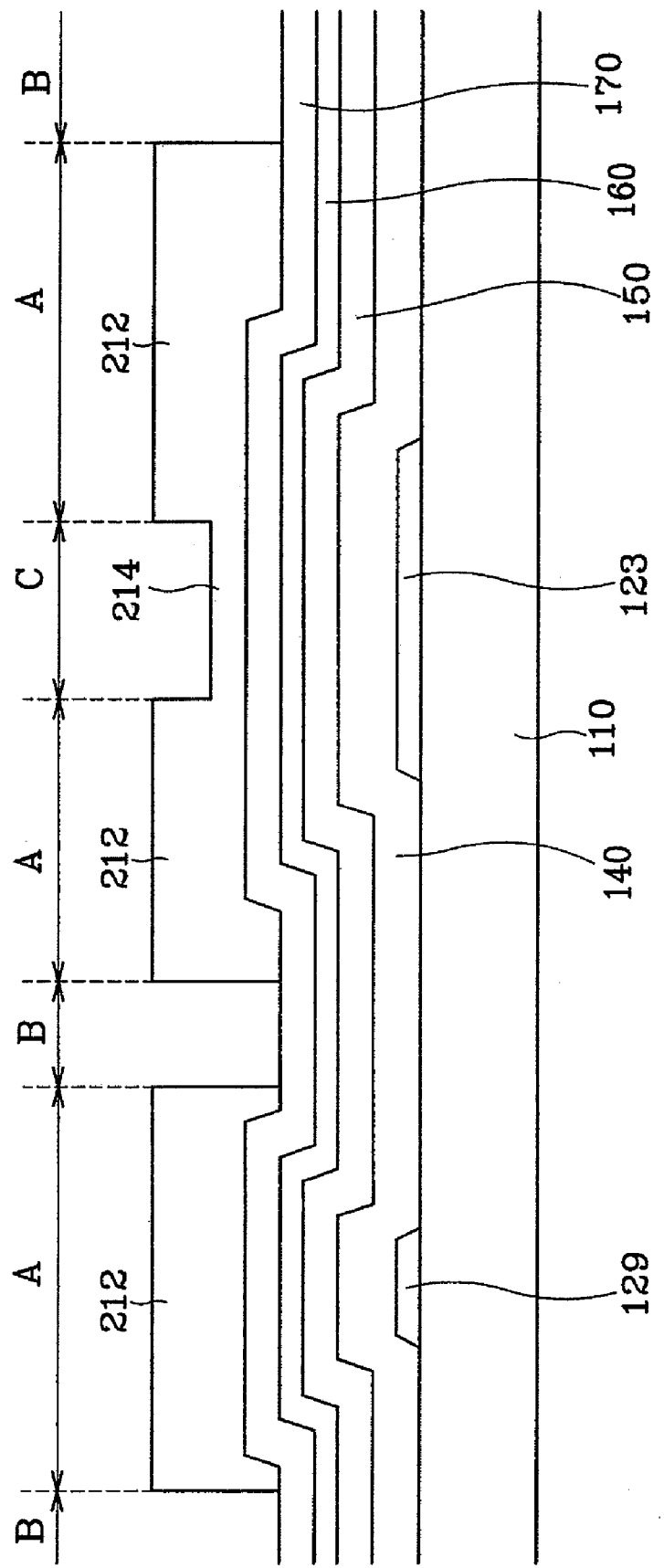

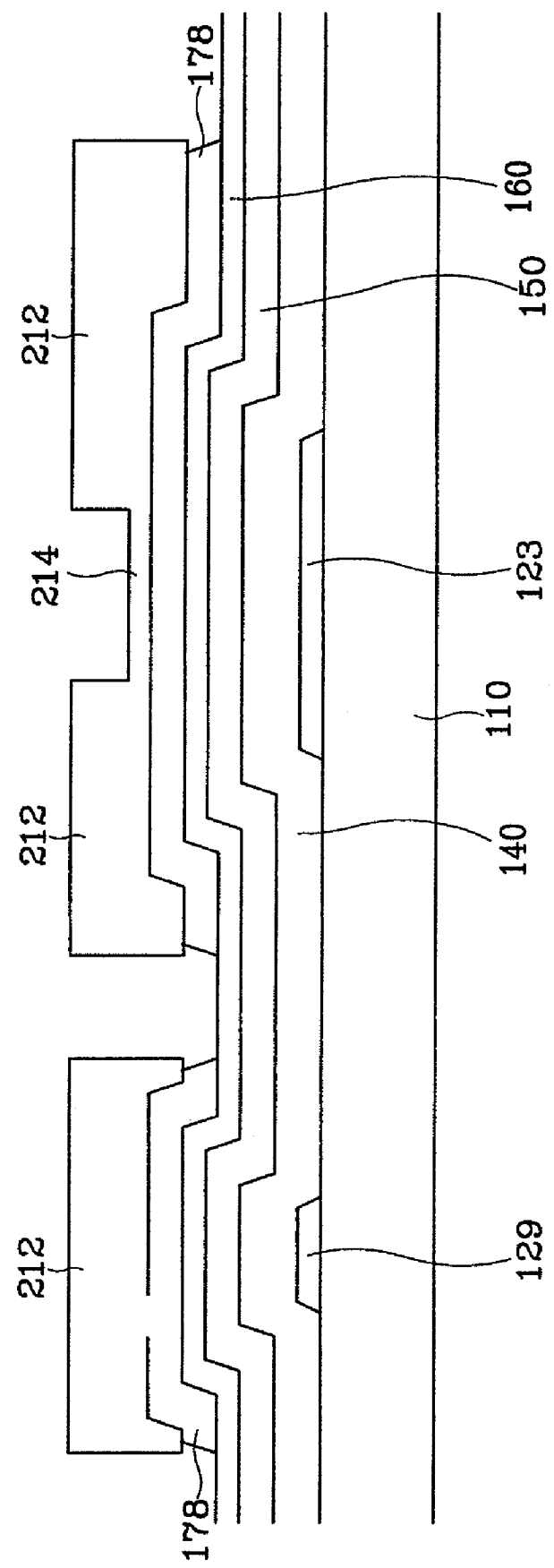

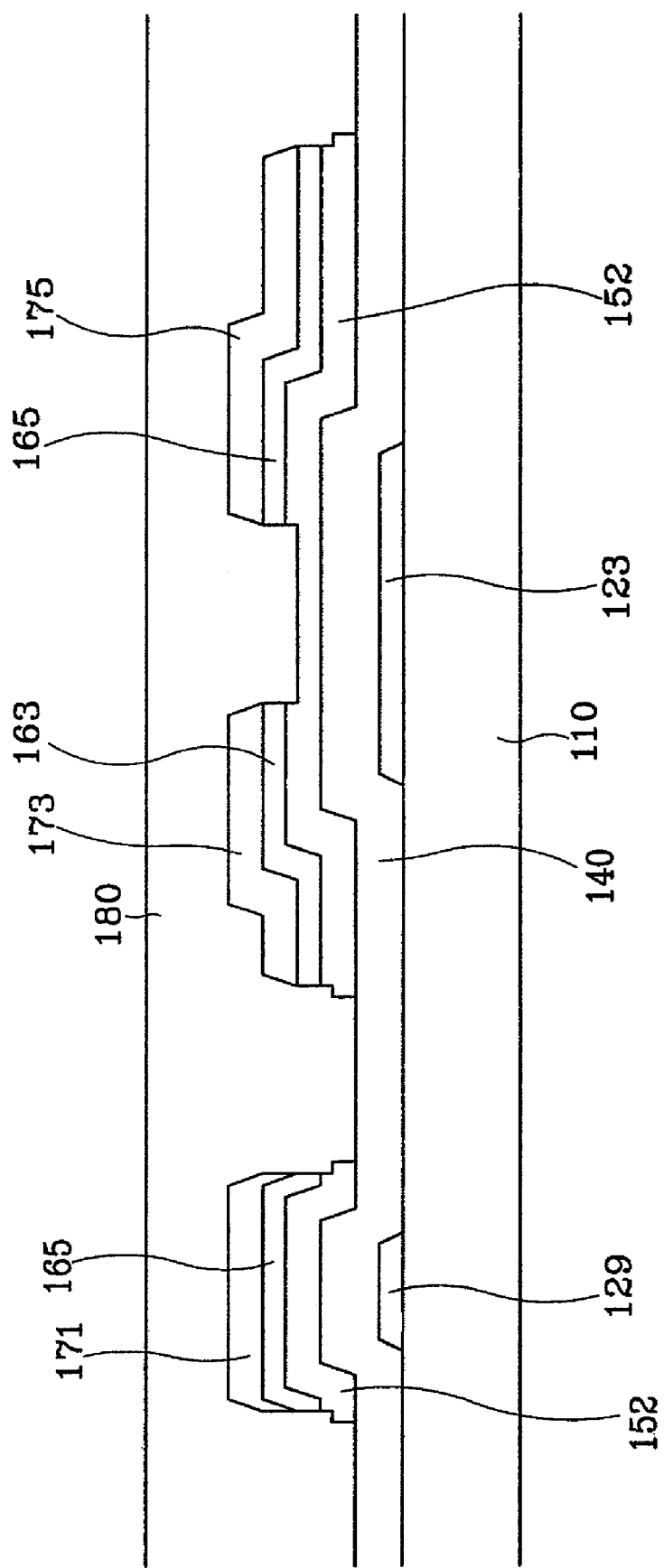

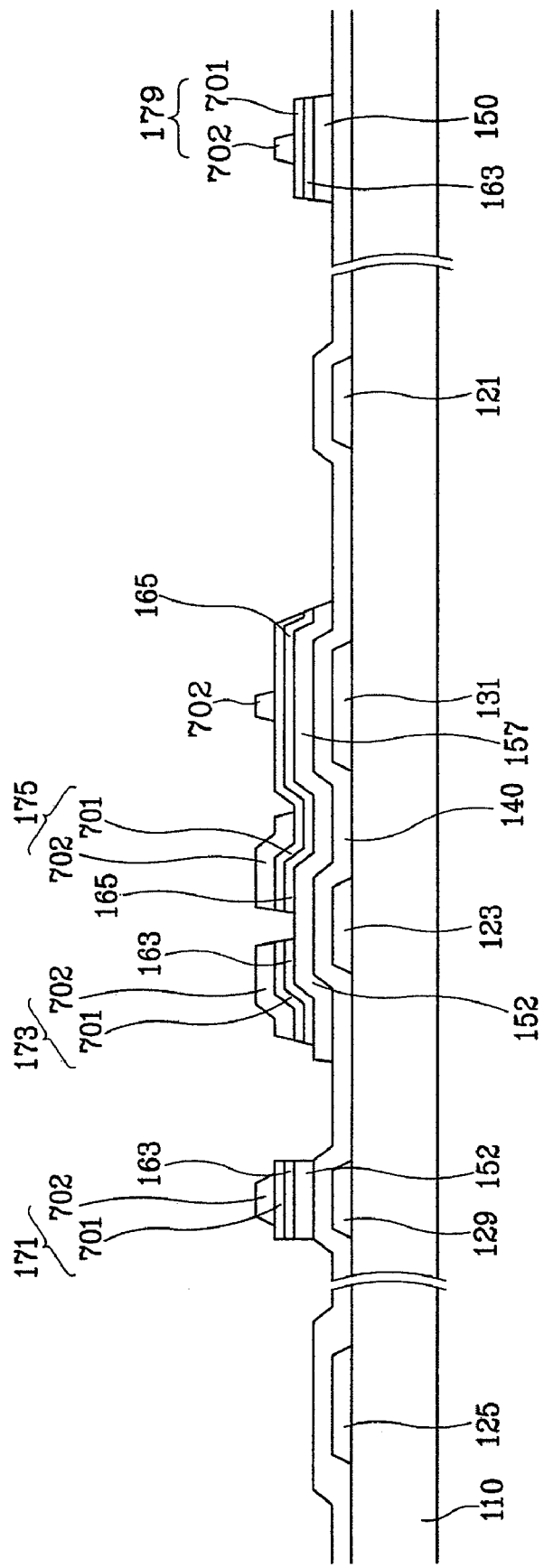

THIN FILM TRANSISTOR ARRAY PANEL AND LIQUID CRYSTAL DISPLAY INCLUDING THE PANEL

CROSS-REFERENCE TO RELATED APPLICATIONS

This application is a continuation of U.S. patent application Ser. No. 10/738,648, filed Dec. 17, 2003 now U.S. Pat. No. 7,436,474 which claims priority to Korean Patent Application No. 2002-80812, filed Dec. 17, 2002, the contents of which are herein incorporated by reference in their entireties.

BACKGROUND OF THE INVENTION (a) Field of the Invention

The present invention relates to a thin film transistor array panel and a liquid crystal display including the panel.

(b) Description of Related Art

A liquid crystal display ("LCD") is one of the most prevalent flat panel displays, which includes two panels having field-generating electrodes and a liquid crystal layer interposed therebetween and controls the transmittance of light passing through the liquid crystal layer by adjusting voltages applied to the electrodes to re-arrange liquid crystal molecules in the liquid crystal layer.

The most popular one among those LCDs is one having electrodes on the respective panels and having a plurality of thin film transistors ("TFTs") for switching the voltages applied to the electrodes. Generally, the TFTs are provided on one of the two panels.

On one panel of an LCD, signal wire including gate lines for transmitting gate signals and data lines for transmitting data signals, pixel electrodes to which data signals applied via the data lines are transmitted, TFTs for controlling the data signals to be transmitted to the pixel electrodes using the gate signals, etc. are formed, and, on the other panel of the LCD, color filters for displaying color image and a black matrix for blocking leakage light between pixels and for preventing contrast ratio from decreasing are formed.

For semiconductor layers of the TFTs, hydrogenated amorphous silicon is usually used. The amorphous silicon layers are sometimes remained under the wire to prevent the wire from disconnecting, or they are remained because they cannot be removed during a manufacturing process to simplify the manufacturing process.

However, light from a backlight, which is a light source of an LCD, enters the semiconductor pattern to generate holes or electrons in the amorphous silicon layer, which causes light leakage current, and the light leakage current can be a cause for deterioration of the characteristic of an LCD. Especially, the light leakage current change the data signal, which results in change of pixel voltages transmitted to the pixel electrodes. Therefore, stripes having different brightness appear and move up and down when an image is displayed.

SUMMARY OF THE INVENTION

The present invention is directed to a TFT array panel and an LCD including the panel having better display characteristics.

A TFT array panel and an LCD including the panel are provided with a light blocking member under semiconductor pattern(s) under data lines.

According to an embodiment of the present invention, a gate wire including a gate line and a gate electrode is formed on an insulating substrate of a TFT array panel of an LCD. A data wire including a data line crossing the gate line, a source electrode connected to the data line, and a drain electrode facing the source electrode with reference to the gate electrode is formed on a gate insulating layer covering the gate wire. A semiconductor pattern is formed on the gate insulating layer, a part of which extends under the data line. A light blocking member overlapping the semiconductor pattern under the data line is formed using the same layer as the gate wire. A pixel electrode electrically connected to the drain electrode is also formed on the panel.

It is preferable that the width of the light blocking member overlapping the semiconductor pattern is equal to or larger than 60% compared to the width of the semiconductor pattern. The semiconductor pattern under the data line is formed to have a width equal to or larger than that of the data line.

The semiconductor pattern may have the same pattern as that of the data wire except a channel portion between the source electrode and the drain electrode, and a part of the semiconductor pattern might stretch out from the edge of the data wire.

The data wire may include a lower layer and an upper layer formed on the lower layer and having a different pattern from the lower layer.

The backlight used as a light source of an LCD including the TFT array panel according to the present invention is driven by an inverter outputting a rectangular wave signal of ON/OFF.

BRIEF DESCRIPTION OF THE DRAWINGS

The present invention will become more apparent by describing preferred embodiments thereof in detail with reference to the accompanying drawings in which:

FIGS. 10B and 10C are sectional views of the TFT array panel shown in FIG. 10A taken along the lines XB-XB' and XC-XC', respectively;

FIGS. 12B and 12C are sectional views of the TFT array panel shown in FIG. 12A taken along the lines XIIB-XIIB' and XIIC-XIIC', respectively;

FIGS. 13A, 14A, and 15A and FIGS. 13B, 14B, and 15B are sectional views of the TFT array panel shown in FIG. 12A taken along the lines XIIB-XIIB' and XIIC-XIIC', respectively, which are the next steps of FIGS. 12B and 12C according to the order of a manufacturing method;

FIGS. 16B and 16C are sectional views of the TFT array panel shown in FIG. 16A taken along the lines XVIB-XVIB' and XVIC-XVIC', respectively;

FIG. 22 is a sectional view of the TFT array panel shown in FIG. 21A taken along the line XXIB-XXIB', which is the next step of FIG. 21B;

DETAILED DESCRIPTION OF EMBODIMENTS

Figure 1:
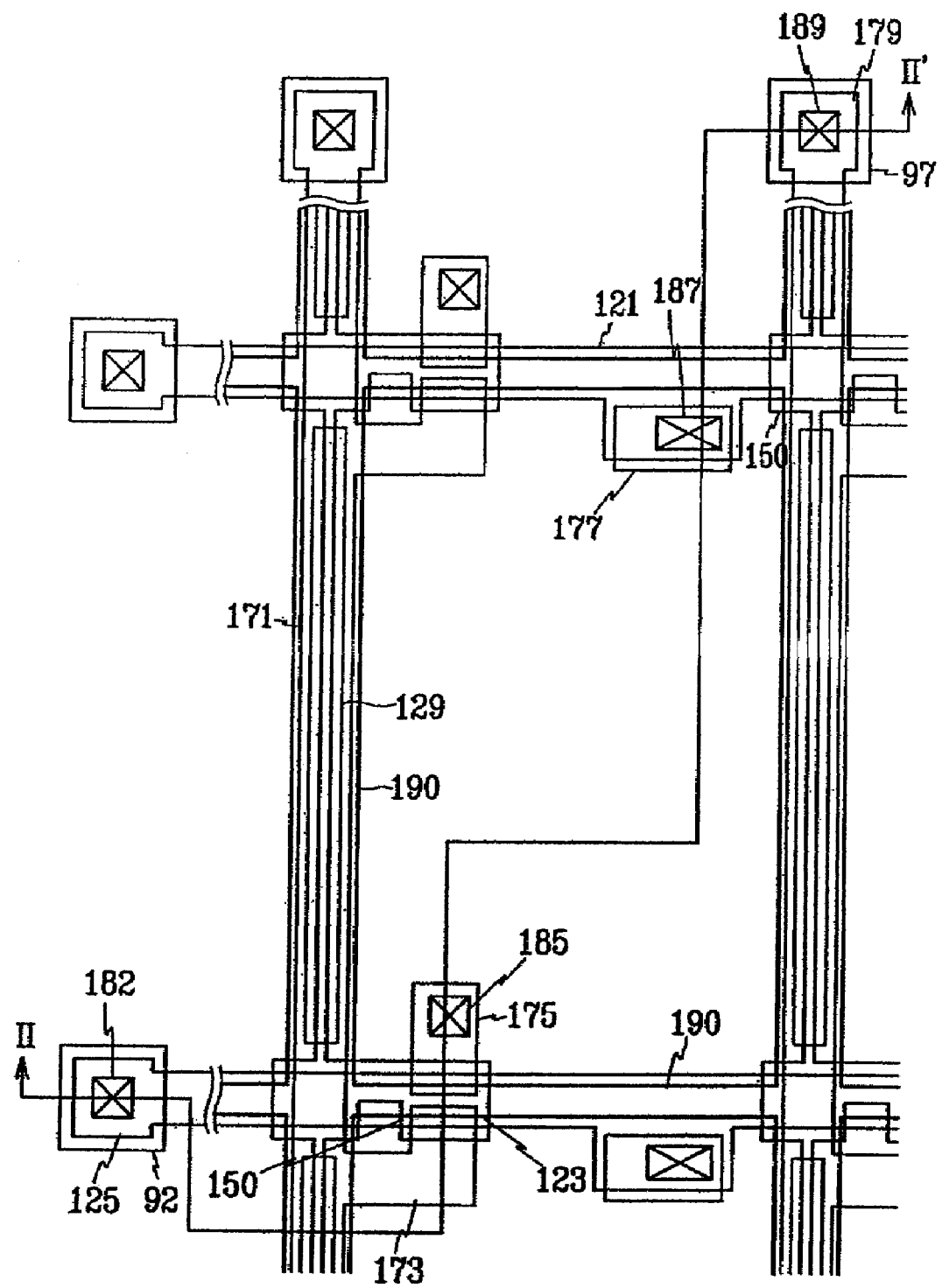
FIG. 1 is a layout view of a TFT array panel for an LCD according to a first embodiment of the present invention.

The present invention now will be described more fully hereinafter with reference to the accompanying drawings, in which embodiments of the inventions invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, TFT array panels and LCDs including the respective TFT array panels according to embodiments of the present invention will be described in detail with reference to the drawings.

First, a TFT array panel for an LCD according to a first embodiment of the present invention will be described with reference to FIGS. 1 and 2.

Figure 2:
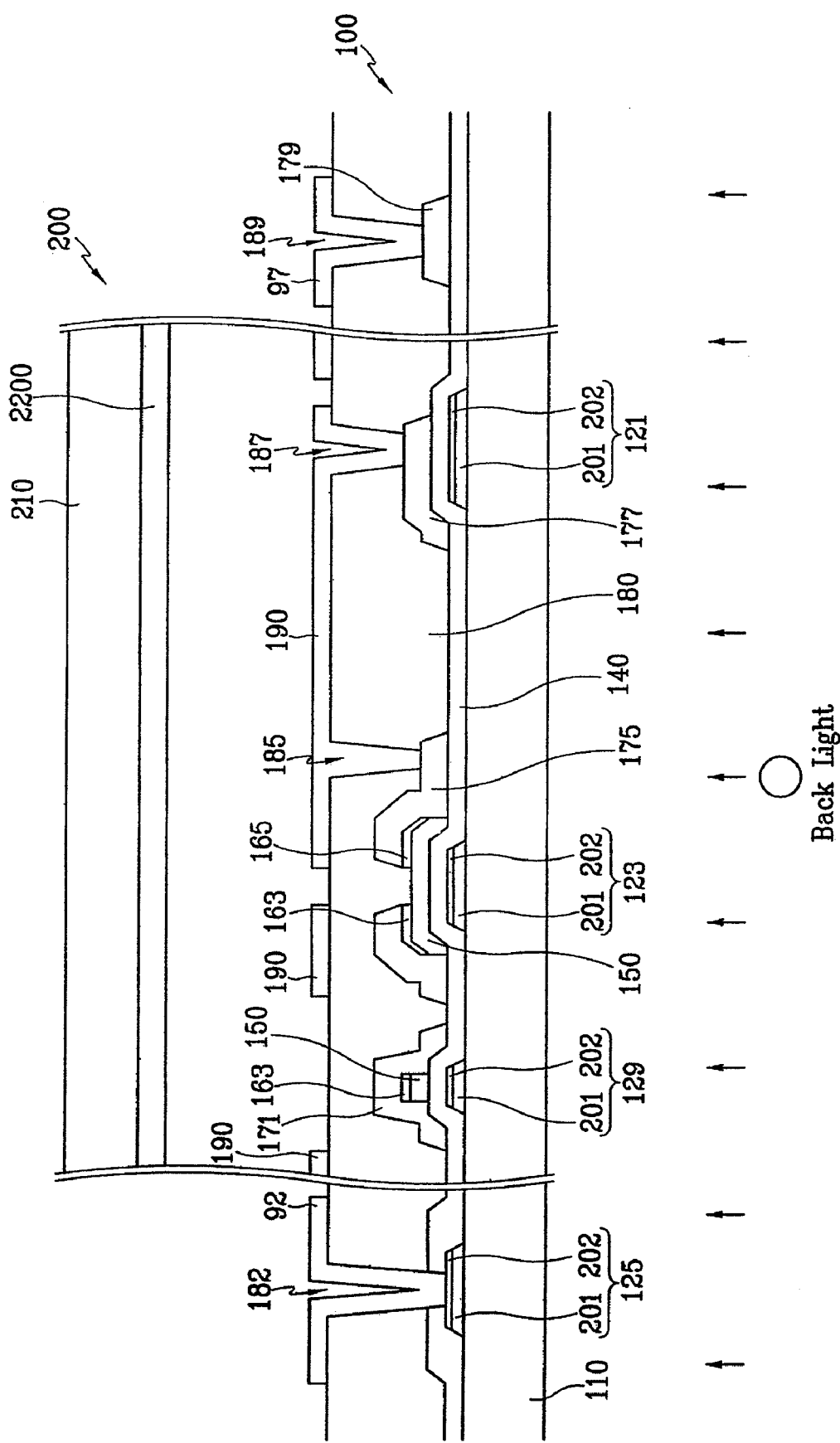
FIG. 2 is a sectional view of an LCD including the TFT array panel shown in FIG. 1 taken along the line II-II'.

FIG. 1 is a layout view of a TFT array panel for an LCD according to an embodiment of the present invention, and FIG. 2 is a sectional view of the TFT array panel shown in FIG. 1 taken along the line II-II' with an opposing panel facing thereto.

A TFT array panel 100 includes a lower insulating substrate 110.

A plurality of gate lines 121 and a plurality of light blocking members 129 are formed on the lower insulating substrate 110.

The gate lines 121 and the light blocking members 129 have a multiple-layered structure including a lower layer 201 made of Al and an upper layer 202 made of a material having good contact characteristic with other materials such as Mo or Cr. In addition, the gate lines 121 and the light blocking members 129 have tapered lateral sides.

The gate lines 121 extend substantially in a transverse direction. An end portion 125 of each gate line 121 receives gate signals from an external device, and a portion 123 of each gate line 121 serves as a gate electrode of a TFT. The gate line 121 also serves as one electrode of a storage capacitor for increasing charge storage capacity of a pixel by overlapping a storage capacitor conductor 177 connected to a pixel electrode 190, which will be described later. When charge storage capacity is not enough yet, an extra storage wire separated from the gate wire may be formed.

The light blocking members 129 extend substantially in a longitudinal direction and are isolated. The light blocking members 129 overlap amorphous silicon layers 150 and 163 under a data line 171, which will be described later, for preventing light incident upon the substrate 110 from a backlight from entering the amorphous silicon layers 150 and 163.

A gate insulating layer 140 preferably made of silicon nitride (SiNx) or the like is formed on the gate lines 121 and the light blocking members 129.

A plurality of semiconductor stripes 150 preferably made of hydrogenated amorphous silicon are formed on the gate insulating layer 140 opposite the gate electrodes 125, and a plurality of ohmic contacts 163 and 165 preferably made of silicide or n+ hydrogenated amorphous silicon heavily doped with n type impurity are formed on the respective semiconductor stripes 150. The ohmic contacts 163 and 165 are separated from each other with respect to the gate electrodes 123.

The amorphous silicon layers 150 and 163 extend substantially in the longitudinal direction along a data line 171, which will be described later, for preventing the disconnection of the data line 171 and overlap the light blocking member 129. The light blocking member 129 has a larger width than the amorphous silicon layers 150 and 163; however, it can have a smaller width than the amorphous silicon layers 150 and 163. The overlapping width is preferably equal to or larger than about 60% of the width of the amorphous silicon layers 150 and 163. The light blocking member 129 is placed between pixel electrodes 190 of adjacent pixel areas, which will be described later, and it preferably does not overlap the pixel electrodes 190.

A plurality of data lines 171, a plurality of drain electrodes 175, and plurality of storage capacitor conductors 177 preferably made of Mo or Mo alloy are formed on the ohmic contacts 163 and 165 and the gate insulating layer 140.

The data lines 171 extend substantially in the longitudinal direction to intersect the gate lines 121 such that the gate lines 121 and the data lines 171 define pixel areas arranged in a matrix. The data line 171 overlaps the light blocking member 129 and the amorphous silicon layers 150 and 163, which extend substantially in the longitudinal direction. A plurality of branches 173 of the data lines 171 extend onto the ohmic contacts 163 to form a plurality of source electrodes 173 of TFTs. An end portion 179 of each data line 171 receives data signals from an external source.

The storage capacitor conductors 177 overlap the gate lines 121 and they are electrically connected to pixel electrodes 190, which will be described later, for increasing storage capacitance.

The data lines 171, the drain electrodes 175, and the storage capacitor conductors 177 may include a conductive layer made of Ag, Ag alloy, Al or Al alloy, like the gate lines 121. Also, the data lines 171, the drain electrodes 175, and the storage capacitor conductors 177 can have a multiple-layered structure including a layer made of Cr, Mo, or Mo alloy. Alternatively, they have a triple-layered structure including two conductive layers made of Mo, or Mo alloy and a conductive layer made of Al interposed therebetween.

A passivation layer 180 preferably made of an insulating material having low dielectric constant such as silicon nitride or a-Si:C:O:H is formed on the data lines 171, the drain electrodes 175, the storage capacitor conductors 177, and portions of the semiconductor stripes 150, which are not covered by the data lines 171, the drain electrodes 175, and the storage capacitor conductors 177. The passivation layer 180 may further include an organic insulating layer made of a photo-sensitive organic material with good planarizability, and it is preferable that the organic insulating layer does not contact the exposed portions of the semiconductor stripes 150 located between the source electrodes 173 and the drain electrodes 175. It is also preferable that the organic insulating material on pad portions, where the end portions 125 and 179 of the gate line 121 and the data line 171 are disposed, is removed completely. Then, it is especially advantageous for a COG (chip on glass) type LCD in which gate driver ICs and data driver ICs for supplying the gate signals and the data signals to the end portions 125 and 179 of the gate lines 121 and the data lines 171 are mounted directly on a TFT array panel.

A plurality of contact holes 185, 187, and 189 respectively exposing the drain electrodes 175, the storage capacitor conductors 177, and the end portions 179 of the data lines 171 are formed through the passivation layer 180, and a plurality of other contact holes 182 exposing the end portions 125 of the gate lines 121 are provided in the passivation layer 180 and the gate insulating layer 140.

A plurality of pixel electrodes 190 and a plurality of contact assistants 92 and 97 are formed on the passivation layer 180. The pixel electrodes 190 and the contact assistants 92 and 97 are preferably made of transparent conductive material such as ITO (indium tin oxide) or IZO (indium zinc oxide).

The pixel electrodes 190 are electrically connected to the drain electrodes 175 via the contact holes 185. It is preferable that the pixel electrode 190 overlaps the data line 171 or the gate line 121 to increase the aspect ratio. However, the pixel electrode 190 may not overlap the data line 171 or the gate line 121 to minimize the interference due to signals transmitted through the data line 171 and the gate line 121 considering dielectric constant of the passivation layer 180.

The contact assistants 92 and 97 are connected to the end portions 125 of the gate lines 121 via the contact holes 182 and to the end portions 179 of the data lines 171 via the contact holes 189, respectively. The contact assistants 92 and 97 are provided for protecting the respective end portions 125 and 179 of the gate lines 121 and the data lines 171, which are not necessary but optional.

An LCD including the TFT array panel 100 according to the first embodiment of the present invention includes an opposing panel 200 facing the TFT array panel 100.

A black matrix (not shown) having openings corresponding to the pixel areas P is formed on an upper insulating substrate 210 of the opposing panel 200 facing the TFT array panel 100, and red, green and blue color filters (not shown) are formed on each pixel area P. A common electrode 210 supplied with a common voltage for driving liquid crystal molecules by cooperating with the pixel electrode 190 is formed on the entire surface of the color filter and the black matrix.

The LCD further includes a backlight emitting light incident upon the TFT array panel 100 from the opposite side of the opposing panel 200 with respect to the TFT array panel 100. The backlight is driven by a rectangular wave of ON/OFF signals outputted from an inverter.

If an LCD does not have the light blocking member 129, light emitted from the backlight enters to the amorphous silicon layers 150 and 163 when the backlight is turned on. Then, electrons and holes are generated in the amorphous silicon layers 150 and 163 by the light, and they re-unite with electrical charges transmitted via the data line 171 when data signals are applied. On the contrary, electrons and holes are not generated when the backlight is turned off. Accordingly, the data signals transmitted via the data lines 171 change depending on On/Off states of the backlight and thus the voltages applied to the pixel electrodes are also changed. Therefore, a plurality of stripes having different luminance are shown on a display screen. In addition, if the on/off frequency of the backlight and a frame frequency, i.e., the driving frequency of the panels are not synchronized, so called a waterfall where the stripes move up and down is generated.

Since an LCD including the TFT array panel according to the first embodiment of the present invention is provided with the light blocking member 129 under the amorphous silicon layers 150 and 163 formed along with the data line 171, the light incident on the amorphous silicon layers 150 and 163 from the backlight may be shut up. Therefore, the light blocking member 129 suppresses the generation of electrons and holes so that the stripes of different brightness and waterfall phenomenon can be removed, thereby improving display characteristic of an LCD.

On the other hand, according to the TFT array panel for an LCD according to the first embodiment of the present invention, the gate lines 121 and/or the data lines 171 include an Al layer having low resistivity, which makes it possible to apply the TFT array panel to a large LCD and to improve the display characteristic.

Then, a manufacturing method of a TFT array panel according to an embodiment of the present invention will be described in more detail with reference to FIGS. 3A-6B and FIGS. 1 and 2.

Figure 3A:
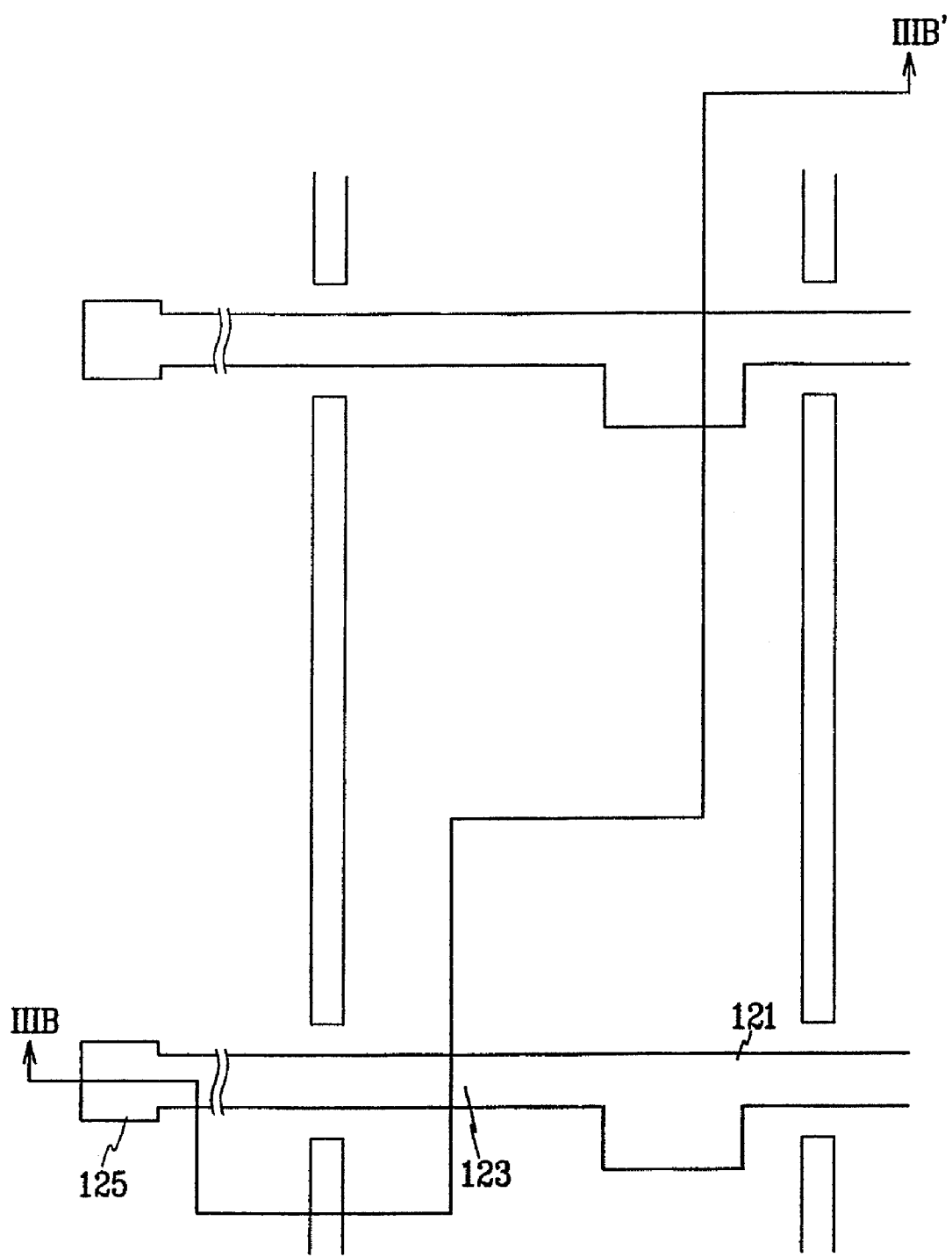
FIGS. 3A, 4A, 5A, and 6A are layout views of a TFT array panel for an LCD according to an embodiment of the present invention in the steps of a manufacturing method.
Figure 3B:
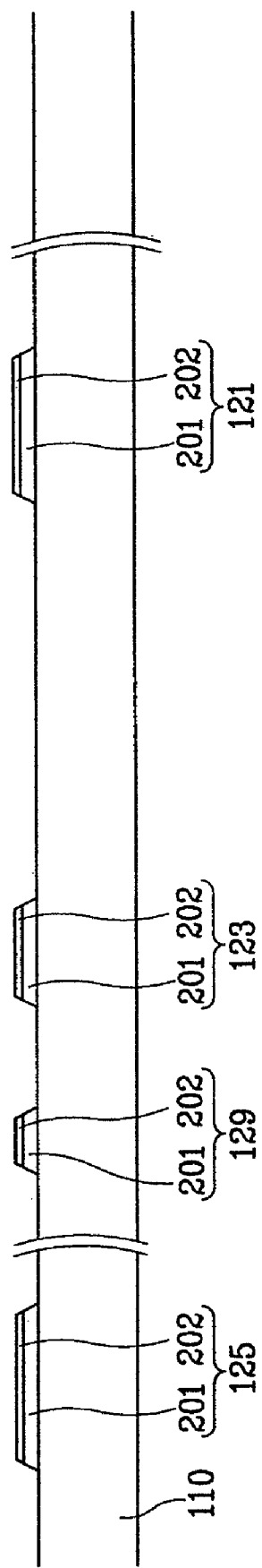
FIG. 3B is a sectional view of the TFT array panel shown in FIG. 3A taken along the line IIIB-IIIB'.

First, as shown in FIGS. 3A and 3B, a lower layer 201 of Al with thickness of 2,000-4,000 Å and an upper layer 202 of Cr, Mo, or Mo alloy with thickness of 500-2,000 Å are deposited in sequence on a glass substrate 110, and the lower layer 201 and the upper layer 202 are patterned together through photolithography using a photo mask to form a plurality of gate lines 121 and a plurality of light blocking members 129. The gate lines 121 and the light blocking members 129 are formed through wet etching to have tapered shape with an inclination angle of 20-80°. When the upper layer 202 is made of Mo of Mo alloy, the two layers may be patterned using the same etching solution and condition.

Figure 4A:
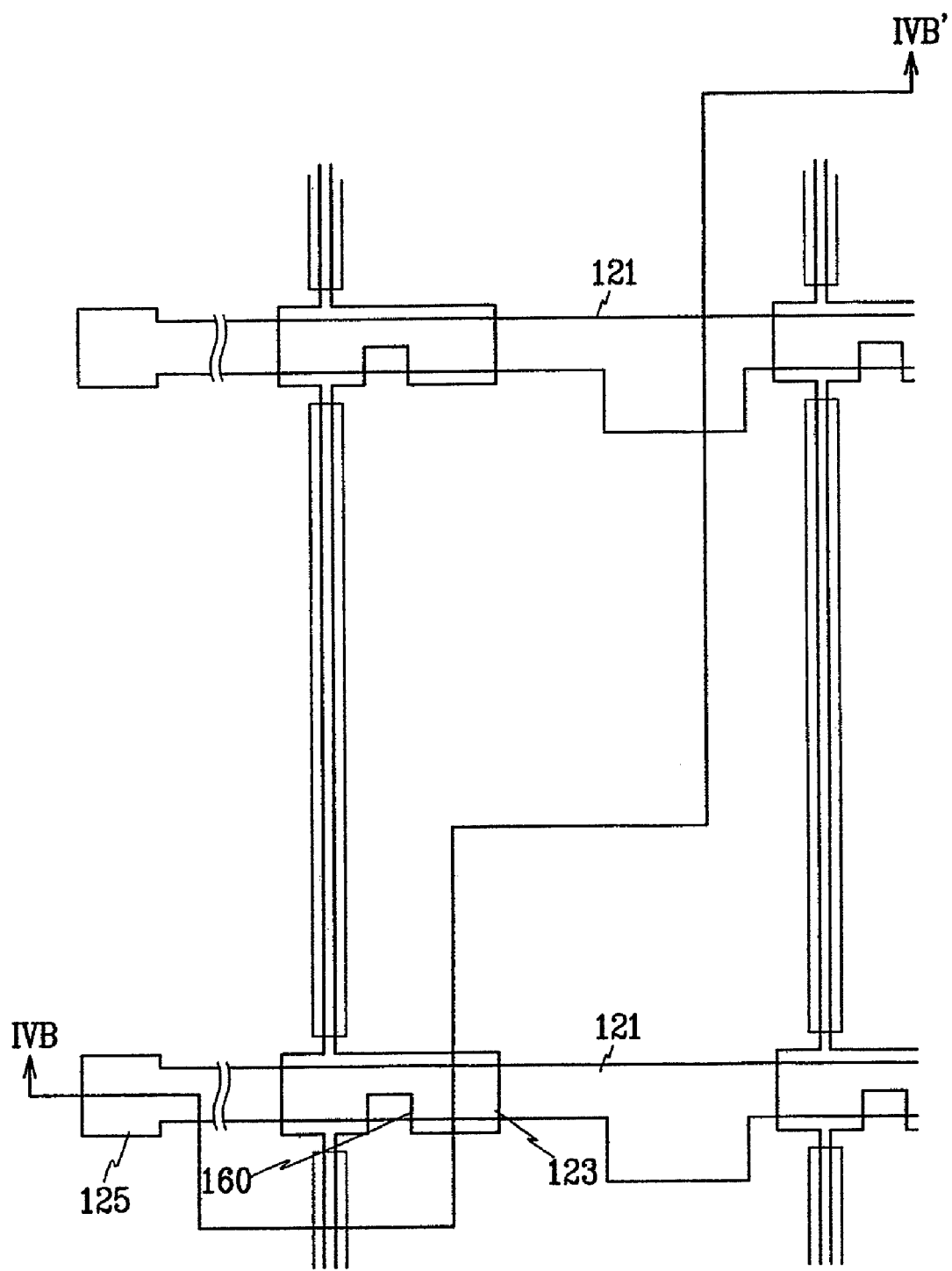
Figure 4B:
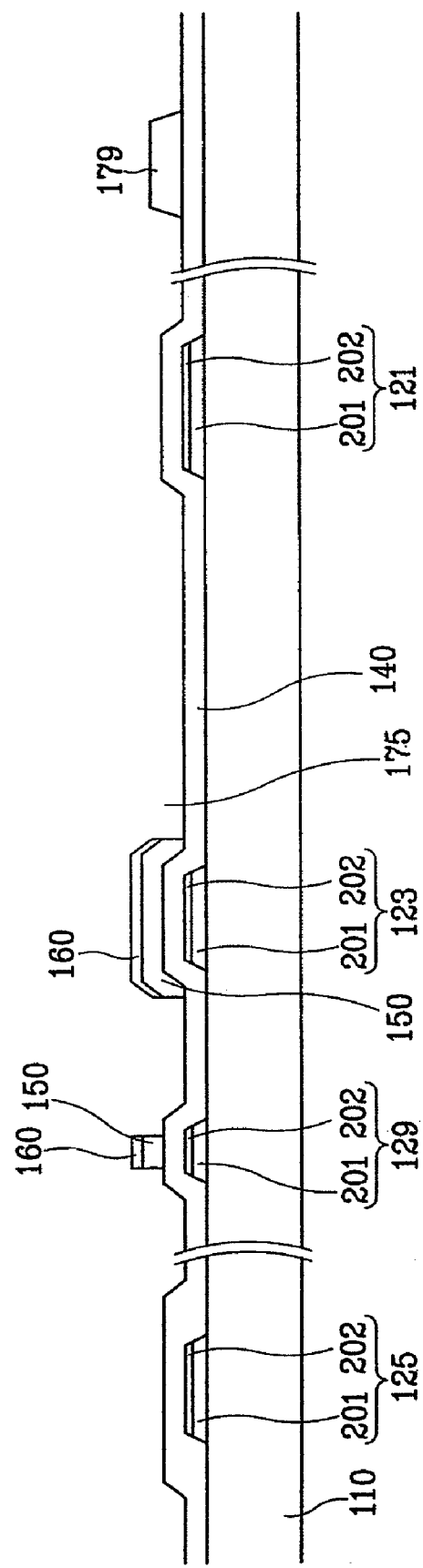
FIG. 4B is a sectional view of the TFT array panel shown in FIG. 4A taken along the line IVB-IVB', which is the next step of FIG. 3B.

Next, triple layers of a gate insulating layer 140 preferably made of silicon nitride (SiNx), a semiconductor layer 150 preferably made of amorphous silicon (a-Si:H), and a doped amorphous silicon layer (n+ a-Si:H) 180 are deposited in sequence. The upper two layers of the semiconductor layer 150 and the doped amorphous silicon layer 160 are patterned in sequence using a photo mask to form a plurality of semiconductor patterns 150 and a plurality of doped amorphous silicon patterns 160 on the gate insulating layer 140 opposite the gate electrode 125, as shown in FIGS. 4A and 4B. The two amorphous silicon layers 150 and 160 are patterned together through dry etching and formed in a longitudinal direction along data lines 171 to prevent the data lines from disconnecting due to the height difference of the amorphous silicon layers 150 and 160. However, if light from a backlight driven using an inverter enters into the amorphous silicon layers 150 and 160, display characteristic of an LCD becomes worse. According to an embodiment of the present invention, the light blocking member 129 is formed under the amorphous silicon layers 150 and 160 located under the data line 171 to prevent the light of the backlight from entering the amorphous silicon layers 150 and 160.

Figure 5A:
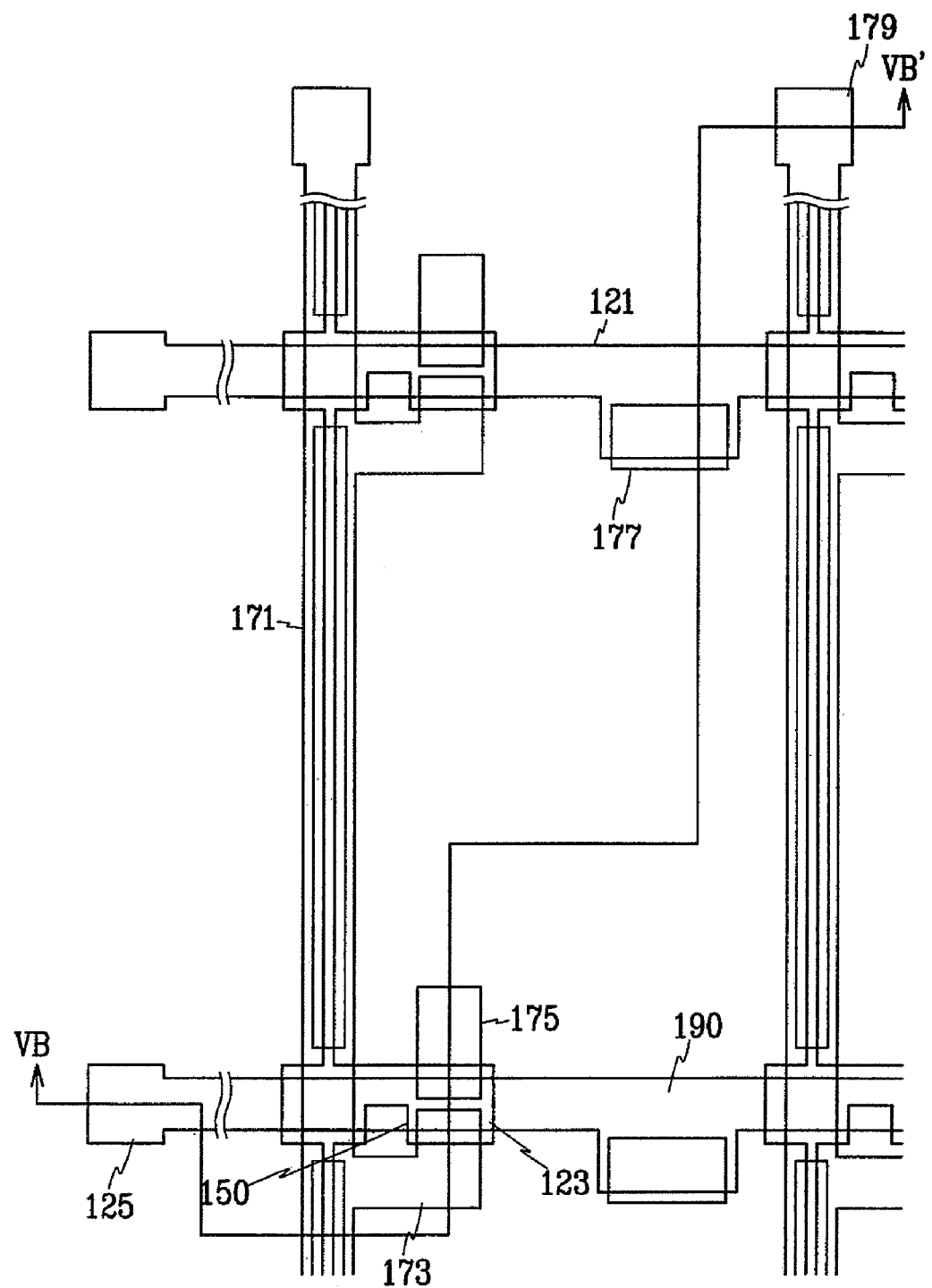
Figure 5B:
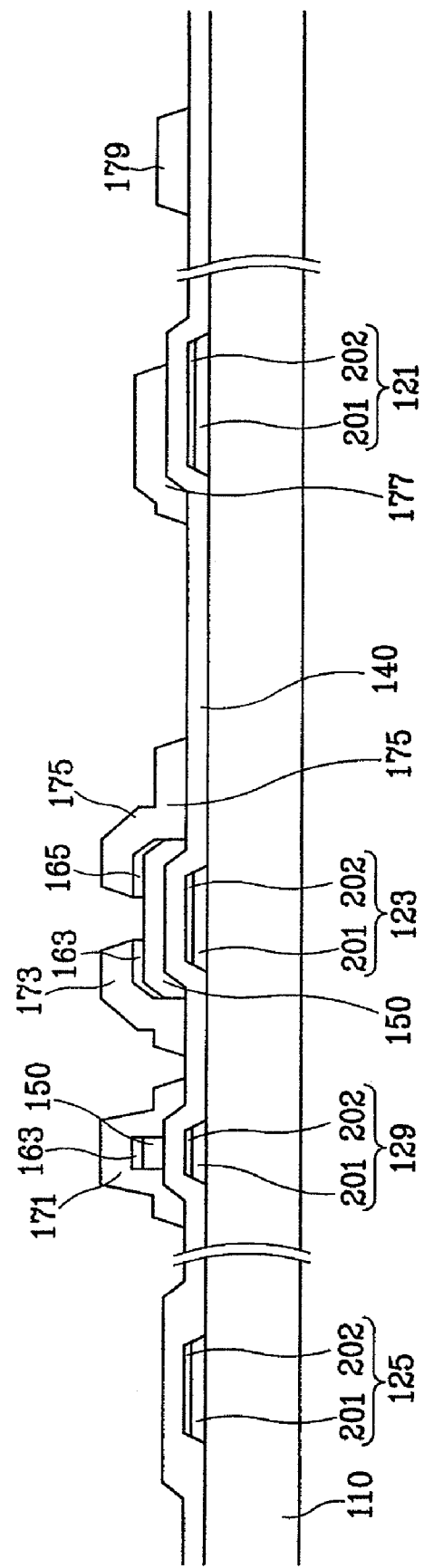
FIG. 5B is a sectional view of the TFT array panel shown in FIG. 5A taken along the line VB-VB', which is the next step of FIG. 4B.

Subsequently, as shown in FIGS. 5A and 5B, a conductive layer of Al or Al alloy or a conductive layer of Cr, Mo, or Mo alloy is deposited to have thickness of 2,000 Å and patterned through photolithography using a photo mask to form a plurality of data lines 171 intersecting the gate lines 121, a plurality of drain electrodes 175, and a plurality of storage capacitor conductors 177 to have tapered shape.

The data wire 171 may include a conductive layer made of Al, and, if so, it is preferable that the conductive layer made of Al is located to be a center layer and two conductive layers made of Mo or Mo alloy are formed over and under the Al layer.

Thereafter, portions of the doped amorphous silicon patterns 160, which are not covered with the data lines 171 and the drain electrodes 175, are removed so that each part of the doped amorphous silicon patterns 160 over the gate electrodes 123 is divided into two ohmic contacts 163 and 165 with respect to the gate electrode 123, and portions of the semiconductor pattern 150 under the removed portions of the doped amorphous silicon patterns 160 are exposed. It is preferable to perform oxygen plasma treatment to stabilize the surface of the exposed portions of the semiconductor pattern 150.

Figure 6A:
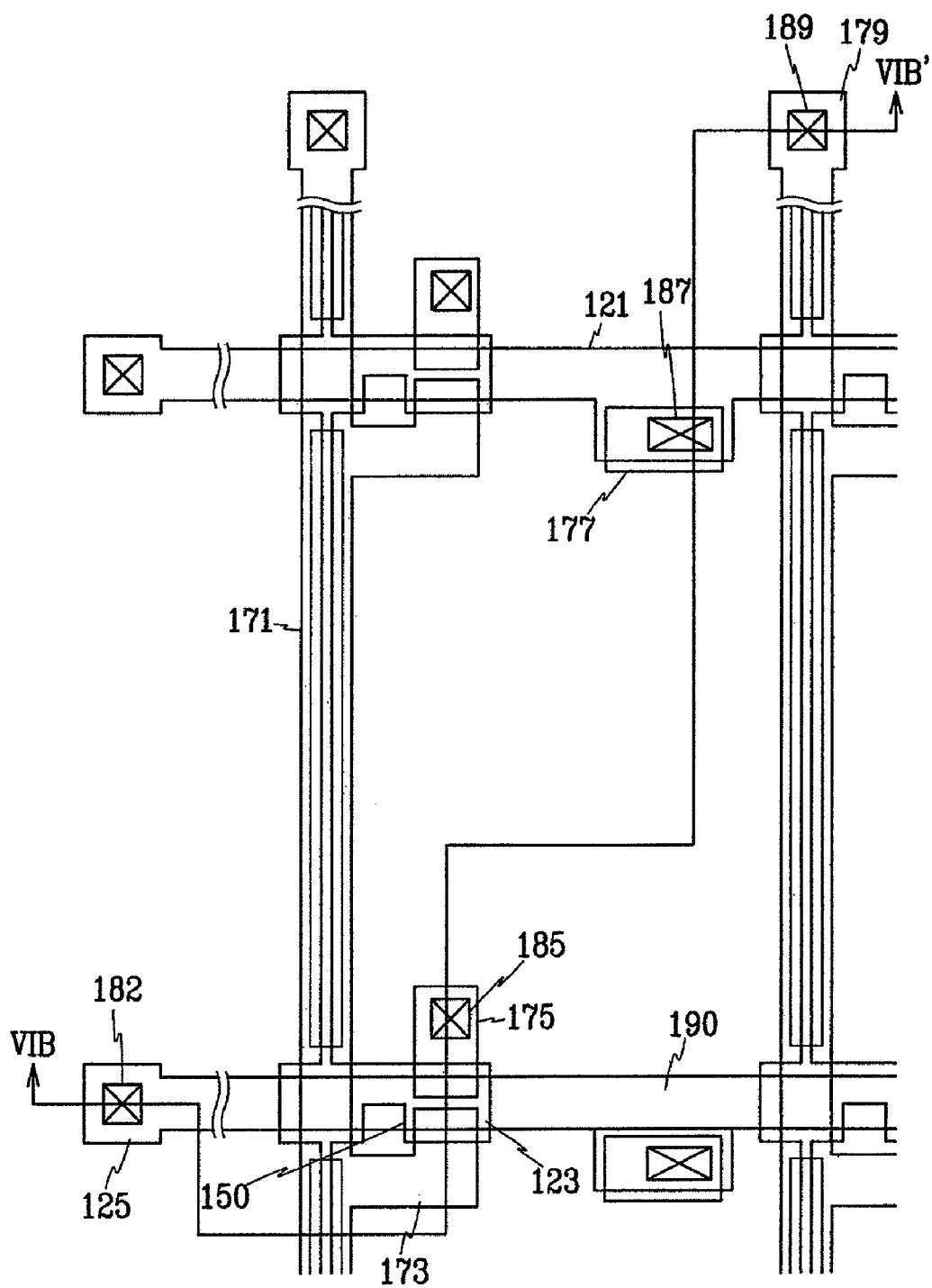
Figure 6B:
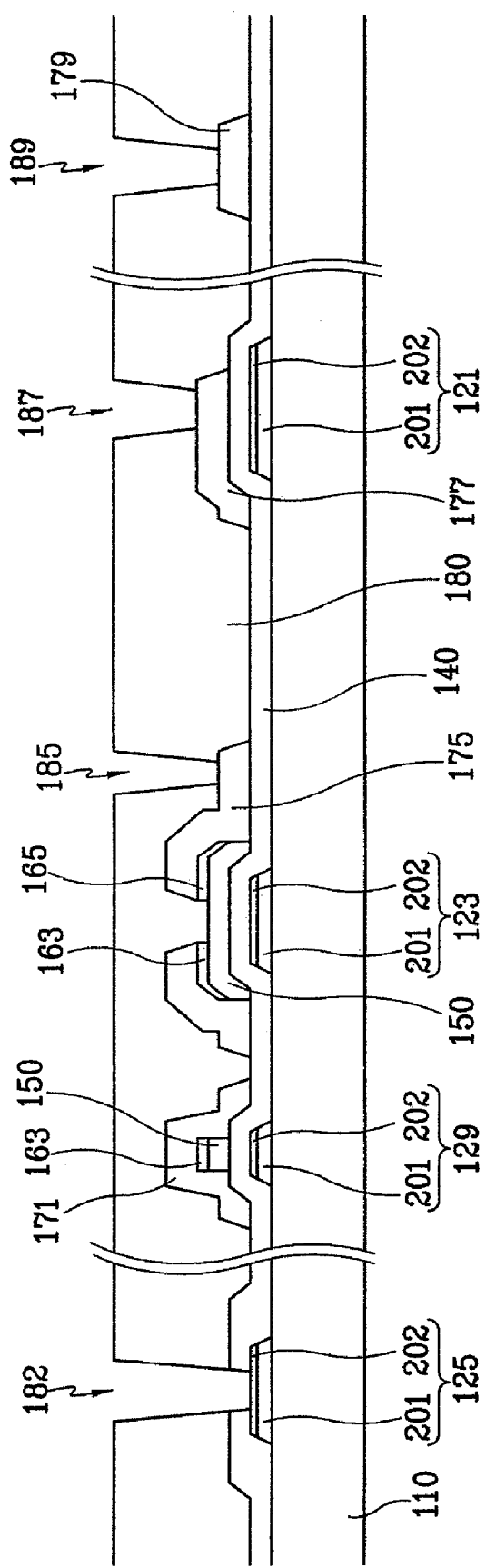
FIG. 6B is a sectional view of the TFT array panel shown in FIG. 6A taken along the line VIB-VIB', which is the next step of FIG. 5B.

Succeedingly, a passivation layer 180 is formed by deposition of nitride or a CVD (chemical vapor deposition) layer with low dielectric constant such as a-Si:C:O or a-Si:O:F using PECVD (plasma enhanced chemical vapor deposition). Thereafter, as shown in FIGS. 6A and 6B, the passivation layer 180 and the gate insulating layer 140 are patterned through photolithography to form a plurality of contact holes 182, 185, 189, and 187 exposing end portions 125 of the gate lines 121, the drain electrodes 175, end portions 179 of the data lines 171, and the storage capacitor conductors 177, respectively. If a conductive layer made of Al is exposed through the contact hole 182, 185, 189, or 187, it is preferable to remove the Al layer considering the contact characteristic with pixel electrodes made of ITO or IZO which will be described later.

Subsequently, as shown in FIGS. 1 and 2, an ITO layer or an IZO layer with thickness of 900 Å is deposited and patterned using a photo mask to form a plurality of pixel electrodes 190 connected to the associated drain electrodes 175 and the associated storage capacitor conductors 177 via the contact holes 185 and 187, respectively, and a plurality of gate contact assistants 92 and a plurality of data contact assistants 97 connected to the end portions 125 of the gate lines 121 and the end portions 179 of the data lines 171 via the contact holes 182 and 189, respectively.

Although this embodiment of the present invention forms the semiconductor patterns and the data lines using different photolithography processes using different masks, another embodiment forms the semiconductor patterns and the data line using a mask to minimize the manufacturing cost. It will be described in more detail with reference to the drawings.

Figure 7:
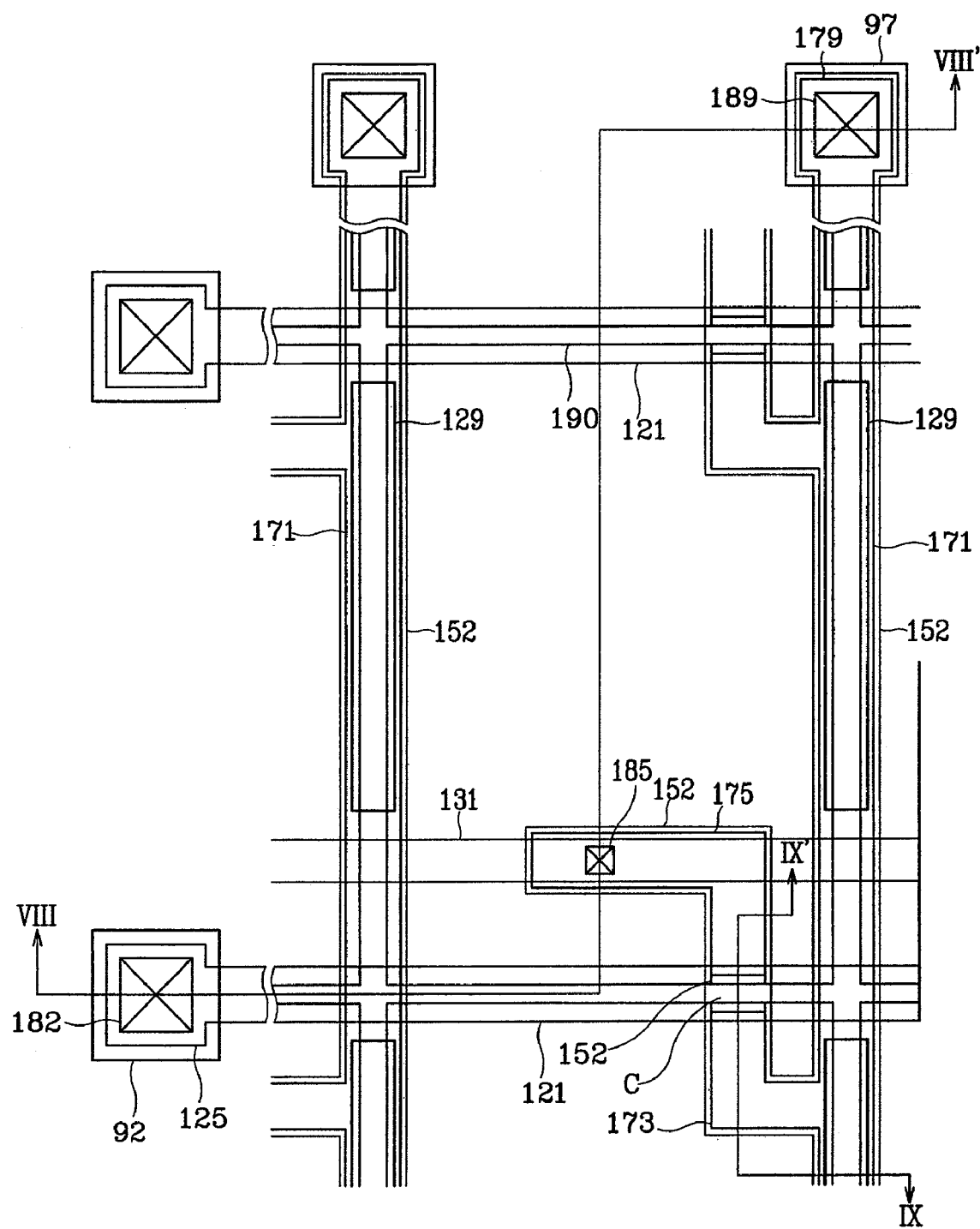
FIG. 7 is a layout view of a TFT array panel for an LCD according to a second embodiment of the present invention.
Figure 8:
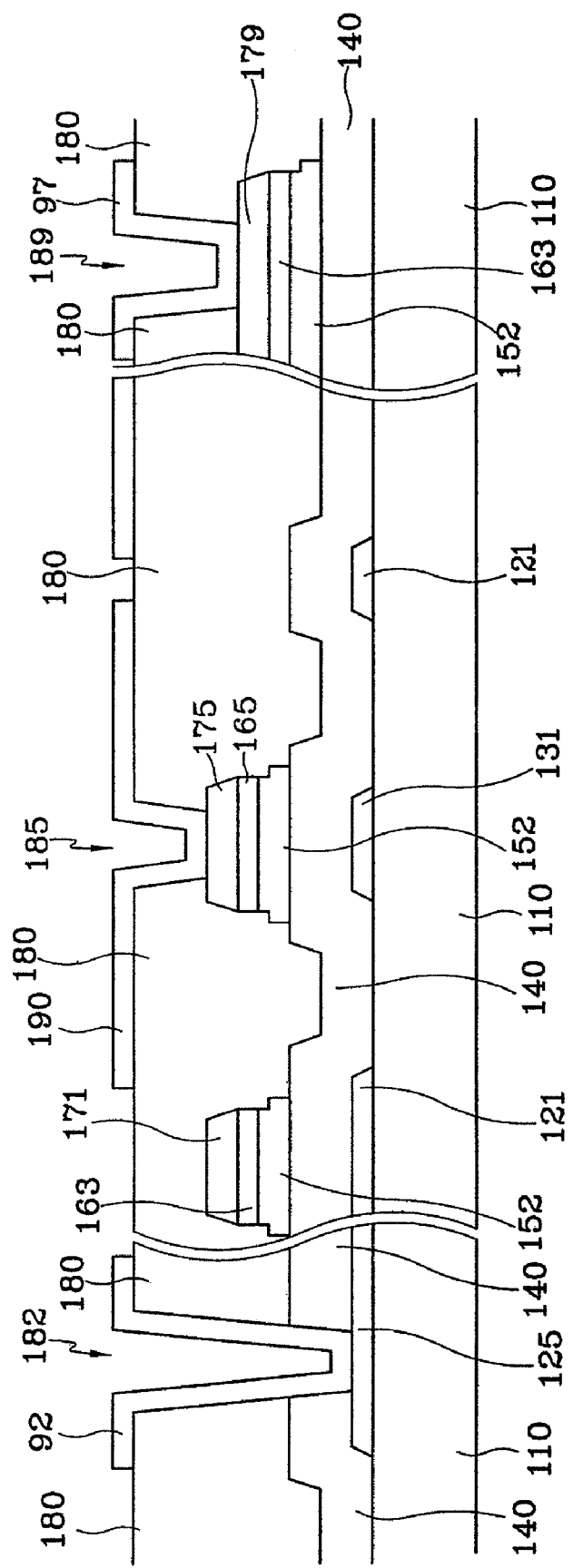
FIGS. 8 and 9 are sectional views of the TFT array panel shown in FIG. 7 taken along the lines VIII-VIII' and IX-IX', respectively.
Figure 9:
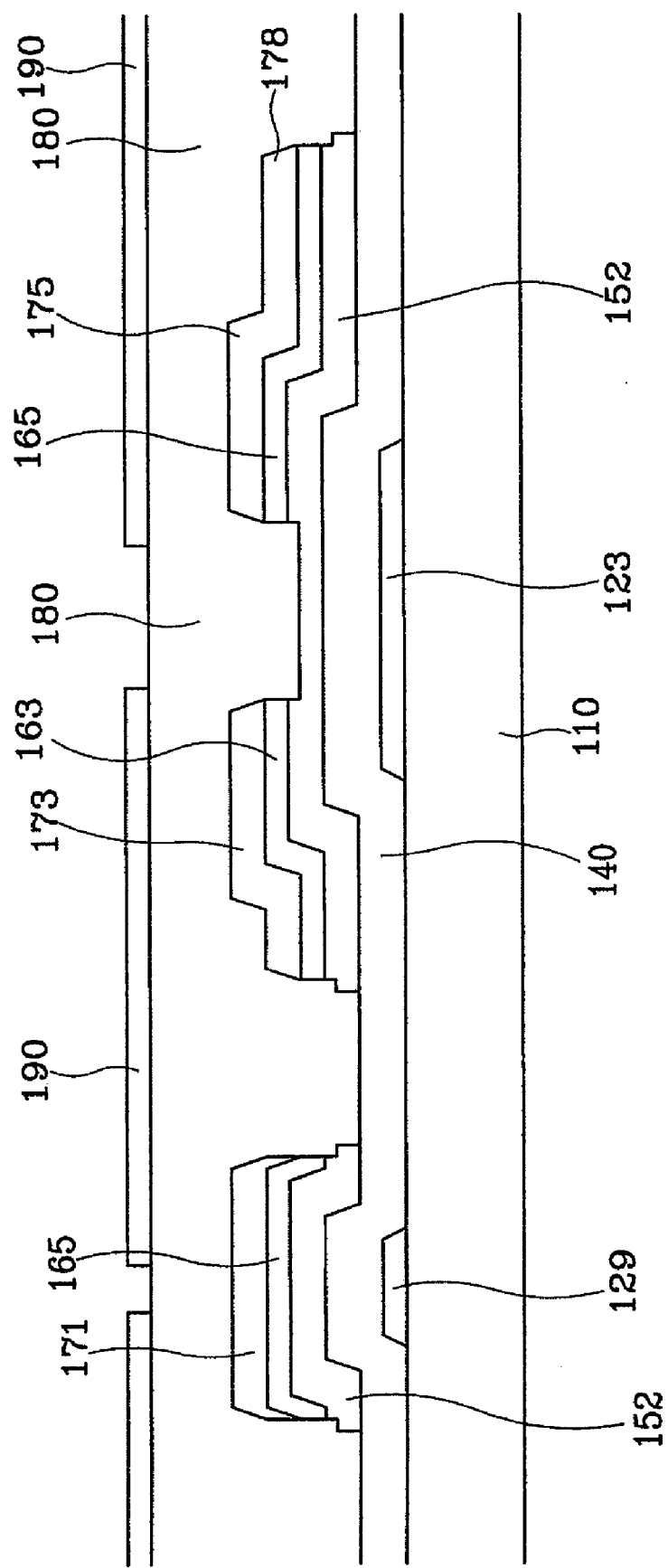

Referring to FIGS. 7-9, a unit pixel structure of a TFT array panel of an LCD according to a second embodiment of the present invention will be described first.

FIG. 7 is a layout view of a TFT array panel of an LCD according to the second embodiment of the present invention, and FIGS. 8 and 9 are sectional views of the TFT array panel shown in FIG. 7 taken along the lines VIII-VIII' and IX-IX', respectively. In FIGS. 8 and 9, an opposing panel is omitted.

A TFT array panel 110 includes an insulating substrate 110. A plurality of gate lines 121, each of which including a conductive layer made of Al, are formed on the insulating substrate 110 to have tapered shape. A plurality of storage electrode lines 131 parallel to the gate lines are formed in the same layer as the gate lines 121. The storage electrode lines 131 are electrically connected to a common electrode (FIG. 2: 220) to receive a common electrode voltage inputted thereto or connected to a previous gate line 121 for transmitting gate signals to TFTs of adjacent pixel row to receive a previous gate voltage. The storage electrode line 131 serves as one electrode of a storage capacitor for increasing charge storage capacity of a pixel by overlapping a drain electrode 175 connected to a pixel electrode 190 which will be described later. However, if storage capacitance from the gate line 121 and the pixel electrode 190 overlapped each other is enough, the storage electrode line 131 may be omitted. A plurality of light blocking members 129, each of which overlaps amorphous silicon layers 152 and 163 under a data line 171, which will be described later, are formed in the same layer as the gate lines 121 to prevent light incident upon the substrate 110 from a backlight from entering the amorphous silicon layers 152 and 163. In this embodiment, the light blocking member 129 has a smaller width than those of amorphous silicon layers 152 and 163. As in the first embodiment, the overlapping width is preferably equal to or larger than 60% of the width of the amorphous silicon layers 152 and 163.

A gate insulating layer 140 preferably made of silicon nitride (SiNx) or the like covers the gate lines 121, the storage electrode lines 131, and the light blocking members 129.

A plurality of semiconductor patterns 152 preferably made of a semiconductor material such as polycrystalline silicon or amorphous silicon are formed on the gate insulating layer 140, and a plurality of ohmic contact layer patterns or center layer patterns 163 and 165 preferably made of amorphous silicon heavily doped with n or p type impurity such as phosphorus (P) are formed on the semiconductor patterns 150.

A plurality of data lines 171 and a plurality of drain electrodes 175 made of Cr, Mo, or Mo alloy are formed on the ohmic contact layer patterns 163 and 165 to have tapered shape. The data lines 171 extend substantially in a longitudinal direction to intersect the gate lines 121, each of which has an end portion 179, to which a data signal is applied, and a source electrode 173 of a TFT. The source electrode 173 is located on an opposite side to the drain electrode 175 overlapping the storage electrode line 131 with respect to a channel portion C of the TFT.

The ohmic contact layer patterns 163 and 165 play a role to lower contact resistance between the semiconductor pattern 152 thereunder and the data line 171 thereon and between the semiconductor pattern 152 thereunder and the drain electrode 175 thereon. The ohmic contact layer patterns 163 and 165 have exactly the same patterns as the data line 171 and the drain electrode 175. That is, the center layer pattern 163 of the data line part is same as the data line 171, and the center layer pattern 163 of the drain electrode is same as the drain electrode 175.

On the other hand, the semiconductor pattern 152 has the same pattern as the data line 171 and the drain electrode 175 and also as the ohmic contact layer patterns 163 and 165 thereunder except the channel portion of the TFT. More specifically, the data line part 171, especially the source electrode 173 and the drain electrode 175 are separated from each other in the channel portion C of the TFT, and the center layer 163 of the data line part and the center layer 165 of the drain electrode part are also separated from each other in the channel portion, while the semiconductor pattern 152 for the TFT is not broken but connected to form the channel of the TFT. The semiconductor pattern 152 stretches out from the edge of the data line 171, and the semiconductor pattern 152 located under the data line 171 has a larger width than that of the light blocking member 129.

A passivation layer 180 including an organic insulating layer preferably made of an insulating material having low dielectric constant or a PECVD layer having low dielectric constant as in the first embodiment is formed on the data lines 171, the drain electrodes 175 and portions of the semiconductor patterns 152 without being covered by the data lines 171 or the drain electrodes 175. A plurality of contact holes 189 and 185 respectively exposing the end portions 179 of the data lines and the drain electrodes 171 are provided in the passivation layer 180, and a plurality of other contact holes 182 exposing the end portions 125 of the gate lines are provided in the passivation layer 180 and the gate insulating layer 140.

A plurality of pixel electrodes 190 for generating electric field together with an electrode of an upper panel by receiving data signals from the TFTs are formed on the passivation layer 180. The pixel electrodes 190 are preferably made of transparent conductive material such as ITO or IZO or conductive material having reflectivity such as Al or Ag, and electrically connected to the drain electrodes 175 via the contact holes 185 to receive the data signals. Even if the pixel electrode 190 overlaps the data line 171 or the gate line 121 to increase the aspect ratio, the interference due to the overlapping is hardly generated because the passivation layer 180 includes the organic insulating layer having low dielectric constant. The light blocking member 129 also shields the leakage light between adjacent pixel areas by overlapping the pixel electrodes 190 of adjacent pixel areas. On the other hand, a plurality of gate contact assistants 92 and data contact assistants 97 respectively connected to the end portions 125 of the gate lines 121 via the contact holes 182 and to the end portions 179 of the data lines 171 via the contact holes 189 are formed on the passivation layer 180. The gate contact assistants 92 and data contact assistants 97 are to protect the respective end portions 125 and 179 of the gate lines 121 and the data lines 171 and to supplement the contact characteristic with external circuit devices, which are not necessary but optional.

Since the TFT array panel according to the second embodiment of the present invention is provided with the light blocking member 129 for shielding light incident on the amorphous silicon layer 163 under the data line 171 when the backlight is turned on as in the first embodiment, the stripes of different brightness and waterfall phenomenon in which the stripes move up and down can be removed thereby improving display characteristic of an LCD.

Then, a manufacturing method of a TFT array panel shown in FIGS. 7-9 will be described in more detail with reference to FIGS. 7-9 and FIGS. 10A-16C.

Figure 10A:
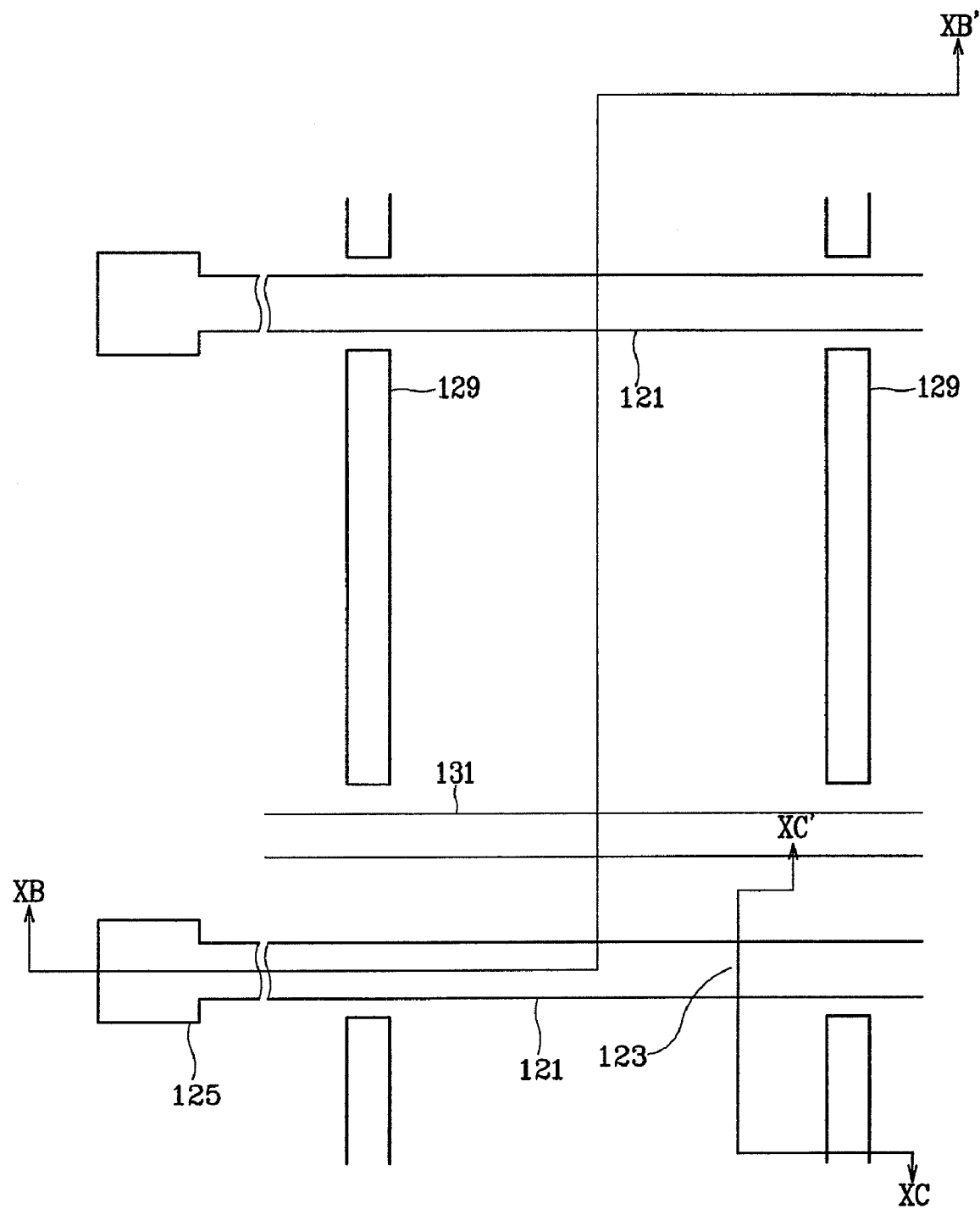
FIG. 10A is a layout view of a TFT array panel for an LCD in the first step of a manufacturing method according to the second embodiment of the present invention.
Figure 10B:
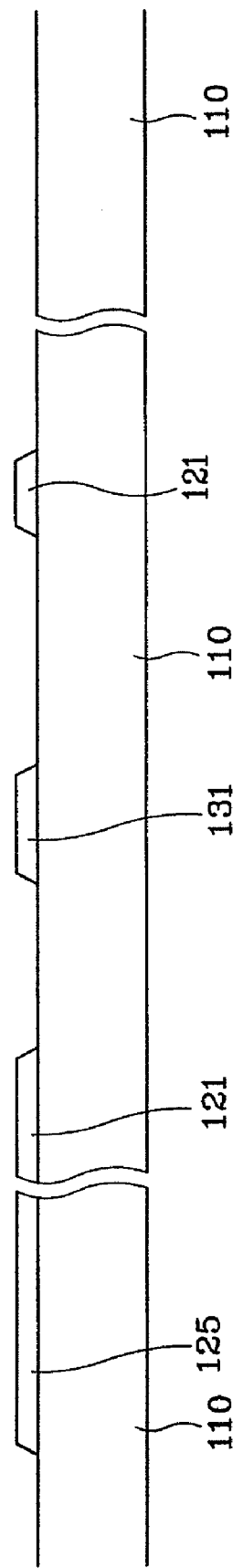

First, as shown in FIGS. 10A-10C, a conductive layer made of Al or a material including Al or a conductive layer made of Cr, Mo, or Mo alloy is deposited and patterned through photolithography using a photo mask to form a plurality of gate lines 121, a plurality of storage electrode lines, and a plurality of light blocking members 129 to have tapered shape.

Figure 11A:
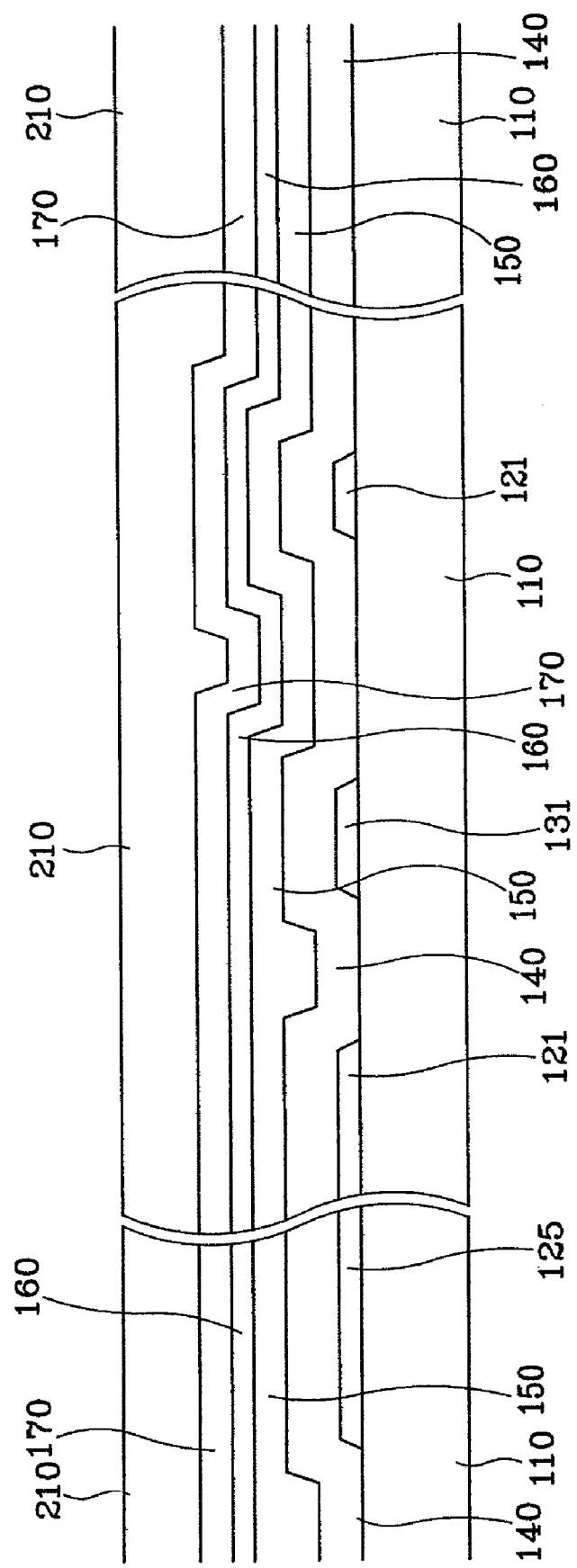
FIGS. 11A and 11B are sectional views of the TFT array panel shown in FIG. 10A taken along the lines XB-XB' and XC-XC', which are the next steps of FIGS. 10B and 10C, respectively.
Figure 11B:
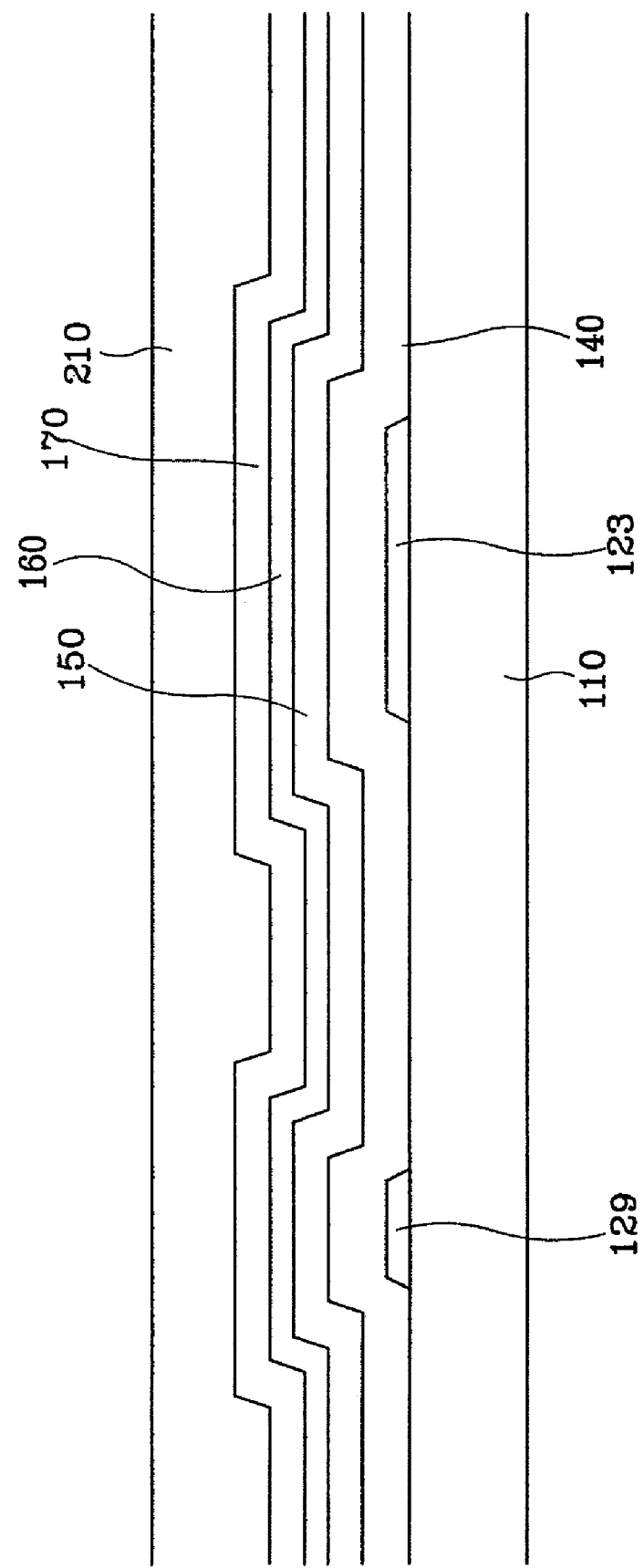

Next, as shown in FIGS. 11A and 11B, triple layers of a gate insulating layer 140 preferably made of silicon nitride (SiNx), a semiconductor layer 150 preferably made of amorphous silicon (a-Si:H), and a doped amorphous silicon layer (n+ a-Si:H) 180 with respective thickness of 1,500-5,000 Å, 500-2,000 Å, and 1400-600 Å are deposited using CVD in sequence. Subsequently, a conductive layer 170 made of a conductive material of Mo or Mo alloy or a conductive material including Al is deposited using sputtering or the like to have a thickness of 1,500-3,000 Å, and a photosensitive film 210 is coated to have a thickness of 1 micron—2 micron, as shown in FIGS. 11A and 11B.

Figure 12A:
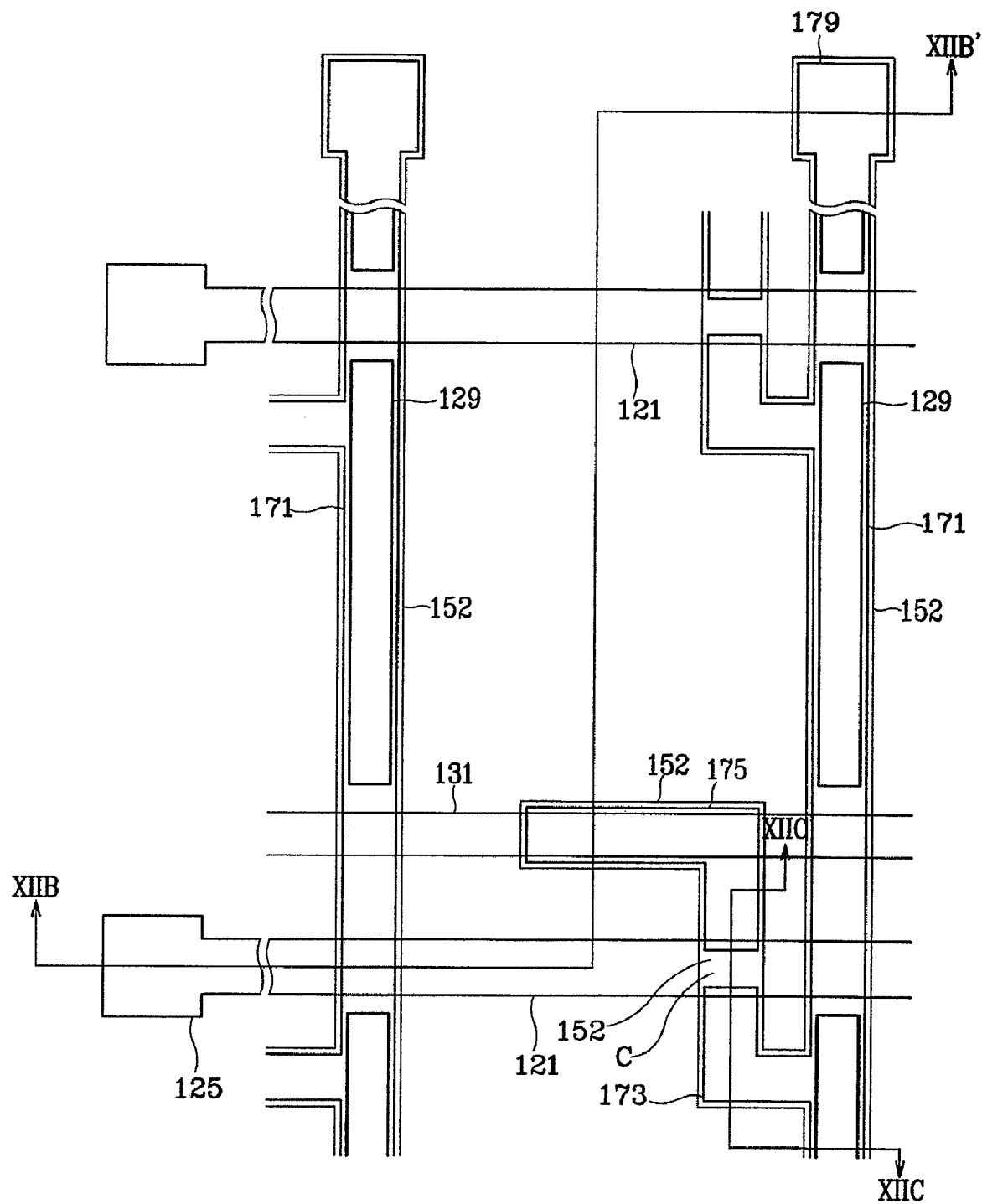
FIG. 12A is a layout view of a TFT array panel for an LCD, which is the next step of FIGS. 11A and 11B.
Figure 12B:
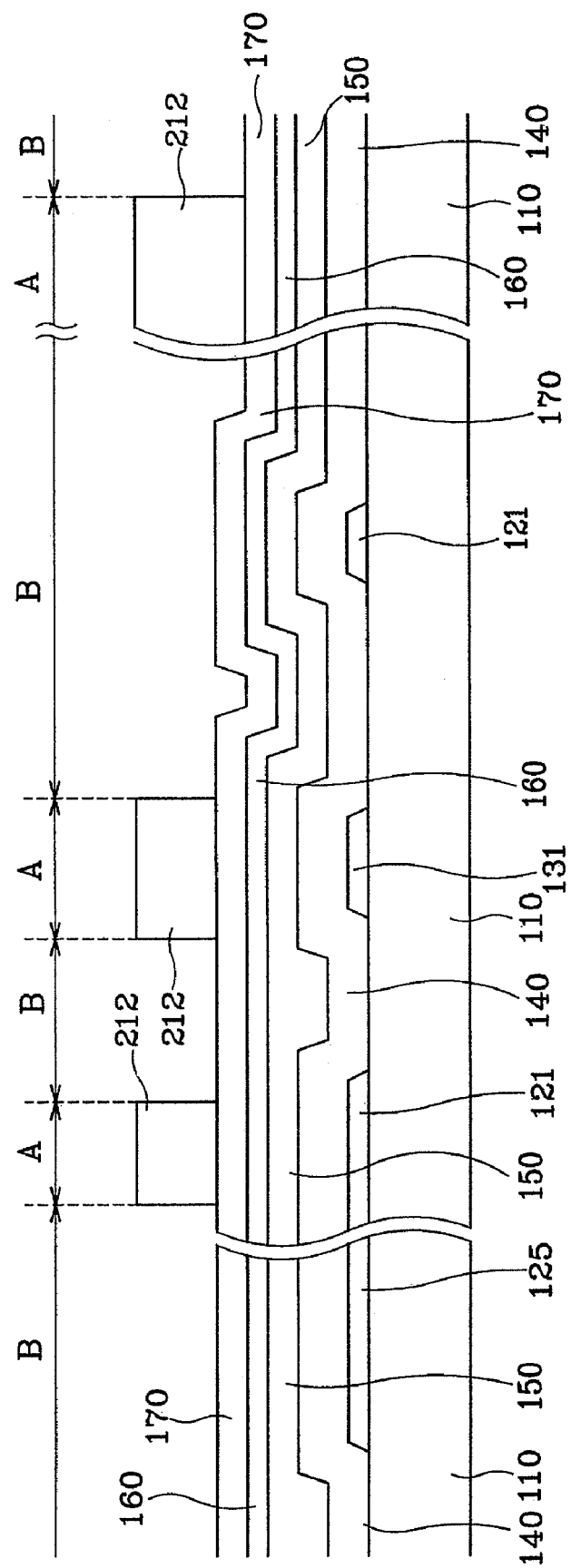

Thereafter, the photosensitive film 210 is exposed to light through a mask and developed to form photosensitive film patterns 212 and 214 as shown in FIGS. 12B and 12C. A first portion 214 among the photosensitive film patterns 212 and 214 located on the channel portion C of the TFT, that is, between the source electrode 173 and the drain electrode 175 is formed to have a smaller thickness than that of a second portion 212 located on the data line portion A, that is, the portion where the data line will be formed, and the photosensitive film of the other portion B is removed. The ratio of the thickness of the photosensitive film portion 214 remained on the channel portion to that of the photosensitive film portion 212 remained on the data line portion varies depending on operational condition of etching, which will be described later, and, preferably, the thickness of the first portion 214 is equal to or less than a half of the thickness of the second portion 212, for example, equal to or less than 4,000 Å.

Various methods may be used for making the thickness of the photosensitive film different depending on location. For example, a mask having a translucent portion with a slit pattern or a lattice pattern is used to control the light transmission in the portion C.

When using a slit pattern, it is preferable that the width of slits or the distance between slits is smaller than the resolution of an exposer used in this step. Alternatively, a mask with a translucent portion is obtained by forming a mask using a plurality of layers having different transmissivity or thickness.

When the photosensitive film is exposed to light using a mask described above, polymers are almost fully dissolved in portions exposed directly to the light, while polymers are hardly dissolved in portions shielded by the mask. In portions where slit pattern or translucent film is formed, a part of polymers is dissolved since light irradiation is not fully achieved. When the photosensitive film is developed, only the portions of the photosensitive film, in which polymers are not dissolved, are remained. That is, the photosensitive film having a smaller thickness than that of the portion that is not exposed to the light is remained in the center portion in which a small amount of light is irradiated. The exposing time should not be too long; otherwise all polymers are dissolved.

The thin photosensitive film 214 may be formed using a material being able to reflow. After coating a photosensitive film made of a material being able to reflow, the photosensitive film is exposed to light using a mask divided into one portion in which the light can fully transmit and the other portion in which the light can fully be blocked. Next, the photosensitive film is developed. Thereafter, the photosensitive film is reflowed to make a part of the photosensitive film run down to the portion without the photosensitive film. Then, a thin layer of the photosensitive film may be formed.

Succeedingly, the photosensitive film pattern 214 and the layers thereunder, i.e., the conductive layer 170, the center layer 160, and the semiconductor pattern 150 are etched. For the data line portion A, the data line and the layers thereunder should be remained as they were. For the channel portion C, the semiconductor pattern and the layers thereunder should be remained. The gate insulating layer 140 should be exposed on the other portion B while the three layers 170, 160, and 150 thereon are completely removed.

Figure 13A:
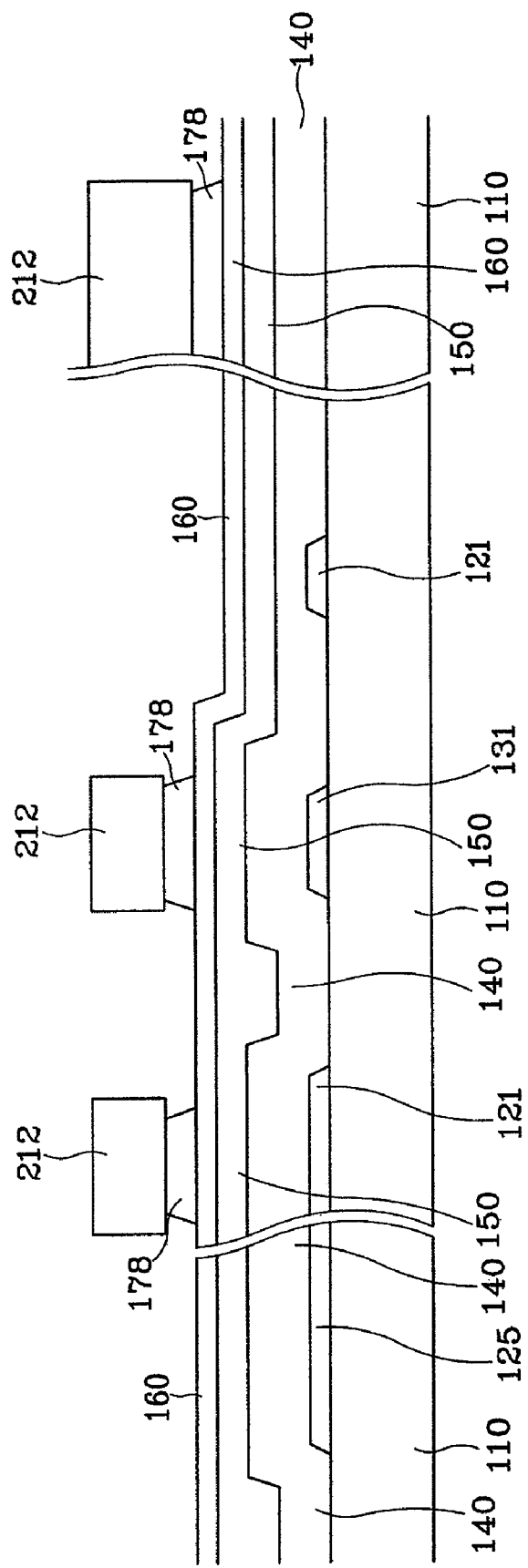

First, as shown in FIGS. 13A and 13B, the conductive layer 170 of the portion B is removed to expose the center layer 160 thereunder. Either dry etching or wet etching can be used for removal of the conductive layer 170, and, preferably, the etching condition is that the conductive layer 170 is etched but the photosensitive film pattern 212 and 214 are hardly etched. However, dry etching condition for selectively etching the conductive layer 170 except the photosensitive film pattern 212 and 214 is difficult to find; therefore, it is possible to apply the condition that the photosensitive film pattern 212 and 214 is etched together. In this case, the first portion 214 of the photosensitive film is formed to have a larger thickness than the case that wet etching is used to prevent the conductive layer 170 thereunder from exposing in the process of dry etching.

Then, as shown in FIGS. 13A and 13B, only the conductive layer in the channel portion C and the data line portion A, i.e., a conductive pattern for source/drain 178, is remained while the conductive layer 170 of the portion B is removed to expose the center layer 160 thereunder. The remaining conductive pattern 178 has the same shape as the data line 171 and the drain electrode 175 except that the source and drain electrodes 173 and 175 are not separated but connected. If the conductive layer 170 is dry etched, a part of the photosensitive film pattern 212 and 214 is etched as well.

Figure 14A:
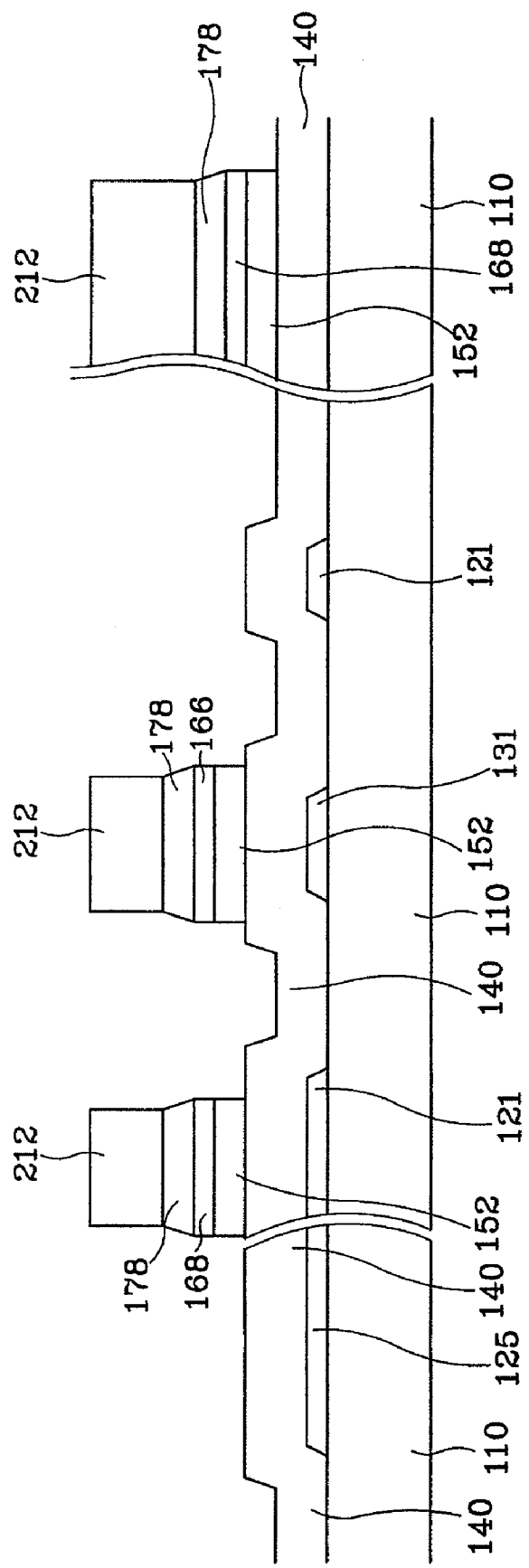
Figure 14B:
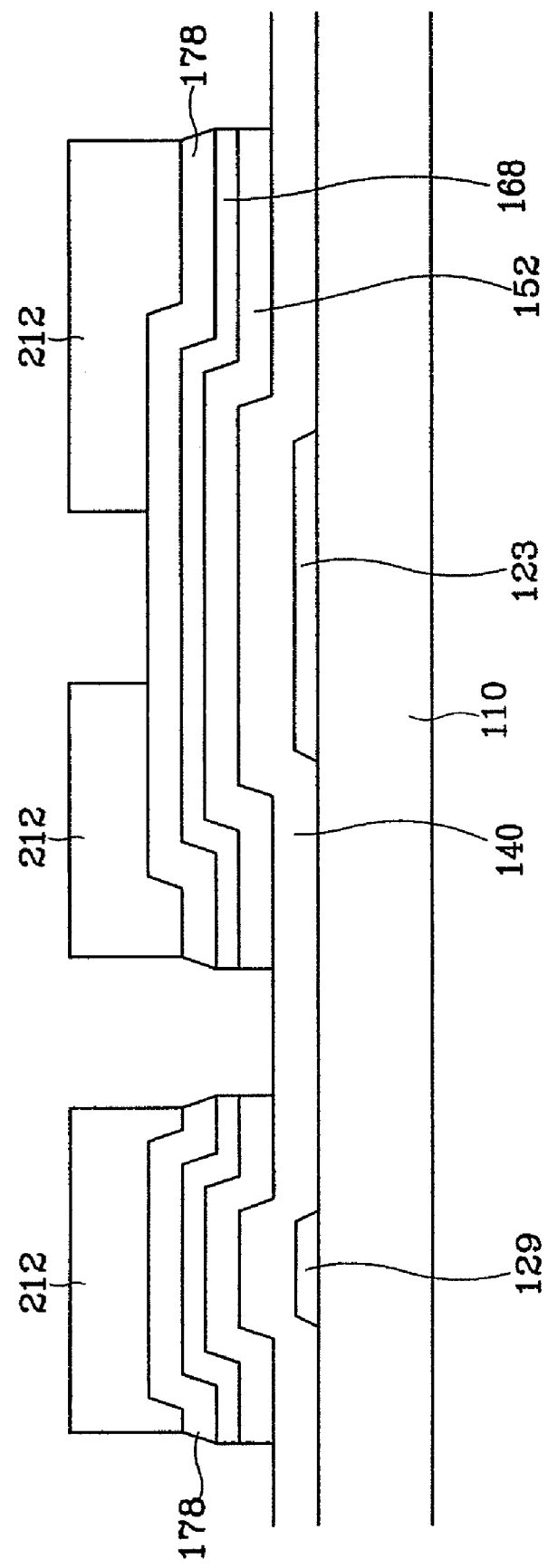

Subsequently, as shown in FIGS. 14A and 14B, the exposed center layer 160 of the portion B and the semiconductor pattern 150 thereunder is removed together with the first portion 214 of the photosensitive film through dry etching. The etching condition is that all of the photosensitive film patterns 212 and 214, the center layer 160, and the semiconductor pattern 150 (the semiconductor pattern and the center layer have little etching selectivity) are etched together but the gate insulating layer 140. Preferably, the etching rates for the photosensitive patterns 212 and 214 and the semiconductor pattern 160 are equal to each other. For example, if a gas mixture of $SF_6$ and HCl or $SF_6$ and $O_2$ is used, both layers can be etched for almost the same thickness. When the etching rates for the photosensitive patterns 212 and 214 and the semiconductor pattern 160 are equal to each other, thickness of the first portion 214 should be equal to or less than the sum of the thickness of the semiconductor pattern 150 and the center layer 160.

Then, as shown in FIGS. 14A and 14B, the first portion 214 on the channel portion C is removed to expose the conductive pattern for source/drain 178, and the center layer 160 and the semiconductor pattern 150 of the portion B are removed to expose the gate insulating layer 140 thereunder. On the other hand, the second portion 212 on the data line portion A is also etched to make the thickness thinner. In this step, the semiconductor pattern 152 is completed. The numeral 168 indicates the center layer pattern under the conductive pattern for source/drain 178.

Now, the photosensitive film residue remained on the surface of the conductive pattern for source/drain 178 of the channel portion is removed by ashing. Then, parts of the photosensitive film pattern 212 are removed for the directions of width and thickness, which makes the edge portions of the conductive pattern for source/drain 178 and the center layer 168 and the semiconductor pattern 152 thereunder stretch out from the photosensitive film pattern 212.

Figure 15A:
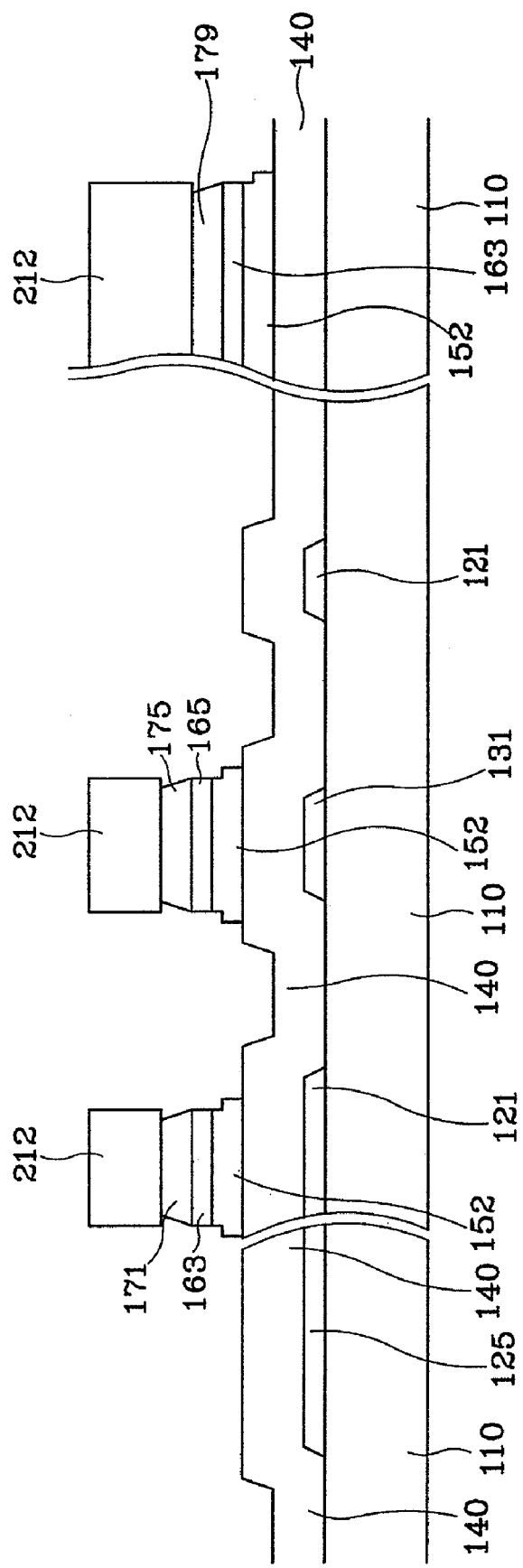
Figure 15B:
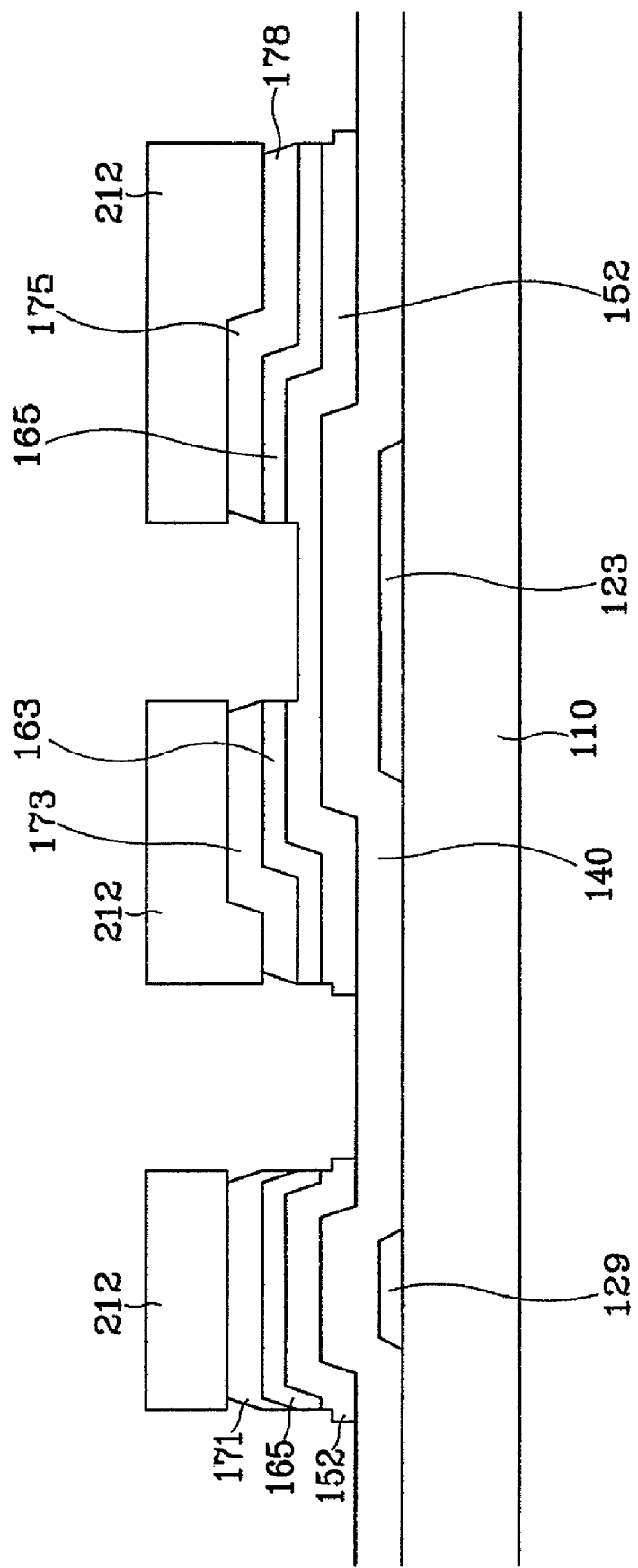

Next, as shown in FIGS. 15A and 15B, the conductive pattern for source/drain 178 of the channel portion C and the center layer pattern for source/drain 168 thereunder are removed through etching. Both the conductive pattern for source/drain 178 and the center layer pattern 168 can be dry etched. Alternatively, the conductive pattern for source/drain 178 is wet etched using an etching solution, and the center layer pattern 168 is dry etched. For the former, it is preferable that the selectivity of the conductive pattern for source/drain 178 and the center layer pattern 168 is relatively large, otherwise it is difficult to find the etch end, which makes it difficult to control the remaining thickness of the semiconductor pattern 152 of the channel portion C. Etching gas for dry etching of the center pattern 168 and the semiconductor pattern 152 may be the gas mixture of $CF_4$ and HCl or $CF_4$ and $O_2$. For the latter, it is possible to make the remaining semiconductor pattern have a uniform thickness. Referring to FIG. 15B, a part of the semiconductor pattern 152 may be removed to make the thickness thinner, and a part of the second portion 212 of the photosensitive film pattern is also etched. The etching condition is that the gate insulating layer 140 is not etched, and the photosensitive film pattern is preferably thick to prevent the second portion 212 from etching, which makes the data line 171 and the drain electrode 175 thereunder be exposed.

Then, as shown in FIG. 12A, the drain electrode 175 is separated from the data line 171 thereby completing the ohmic contact layer patterns 163 and 165 thereunder.

Finally, the second portion 212 of the photosensitive film remained on the data line portion A is removed. Alternatively, the second portion 212 may be removed before removing the center layer pattern 168 after removing the conductive pattern for source/drain 178 of the channel portion C.

As described above, wet etching and dry etching may be used in turn, or only dry etching is used. For the latter, manufacturing process becomes simple because only one kind of etching is used, but proper etching condition is difficult to find. On the other hand, for the former, etching condition is relatively easy to find, but the manufacturing process becomes more complicated than that of the latter.

Figure 16A:
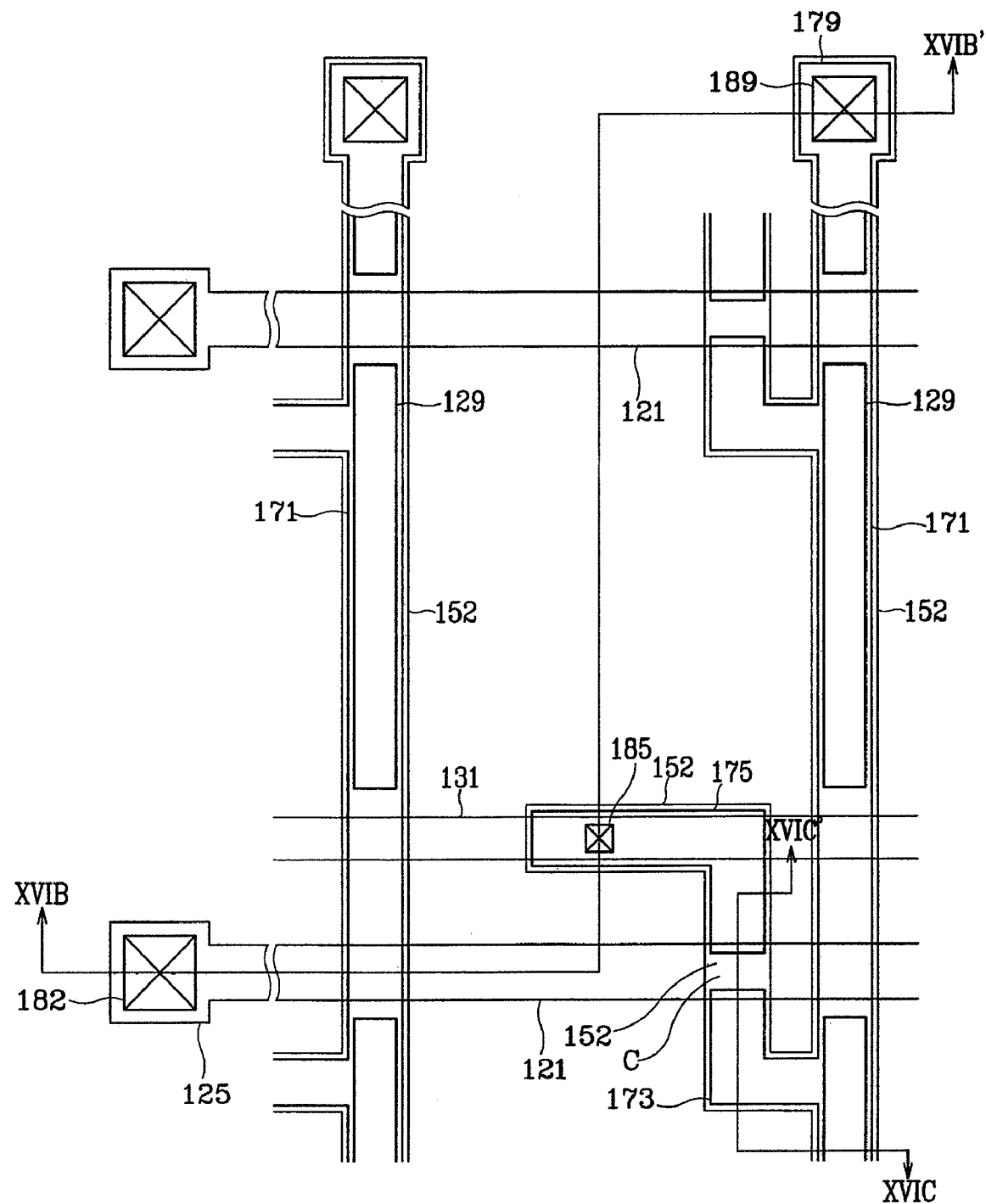
FIG. 16A is a layout view of a TFT array panel for an LCD, which is the next step of FIGS. 15A and 15B.
Figure 16B:
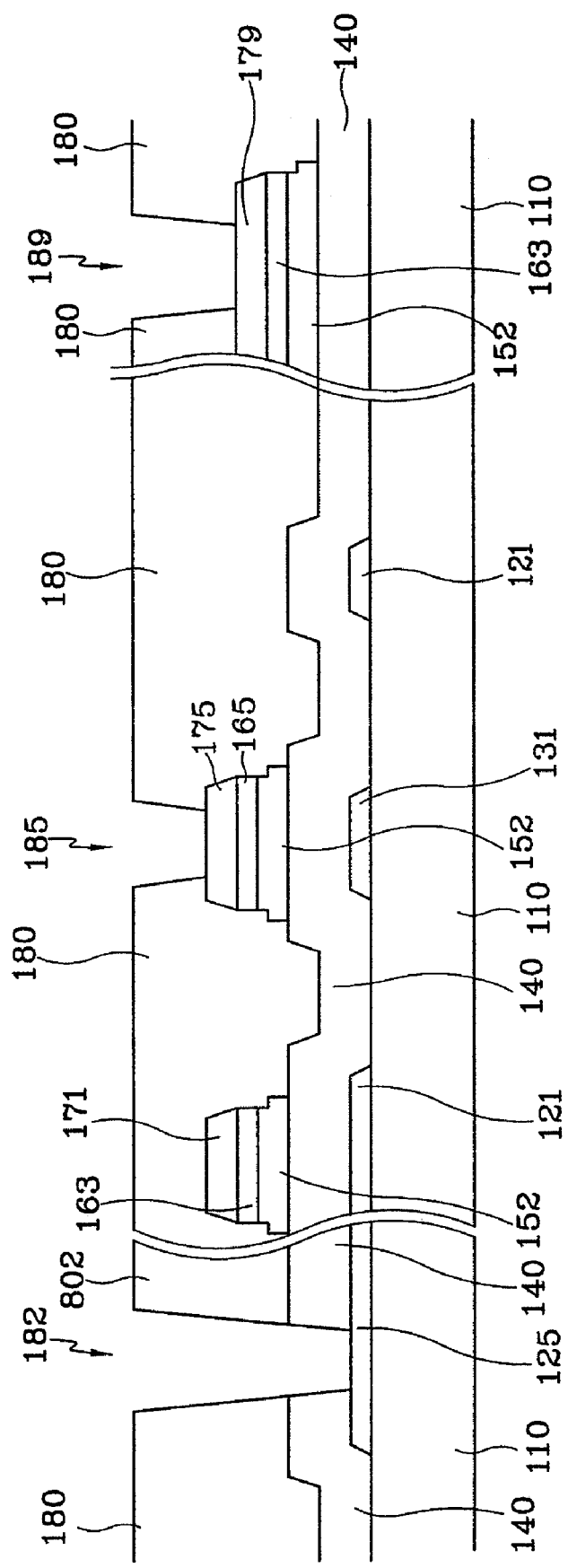

After forming the data line 171 and the drain electrode 175 as described before, a passivation layer 180 is formed by deposition of an organic insulating material. A plurality of contact holes 182, 189, and 185 exposing end portions 125 of the gate lines 121, end portions 179 of the data lines 171, and the drain electrodes 175, respectively, are formed through etching the passivation layer 180 and the gate insulating layer 140 using a mask, as shown in FIGS. 16A-16C.

Subsequently, as shown in FIGS. 7-9, an ITO layer or an IZO layer with thickness of 500-1,000 Å is deposited and wet etched using a mask to form a plurality of pixel electrodes 190 connected to the associated drain electrodes 175 and a plurality of gate contact assistants 92 and a plurality of data contact assistants 97 connected to the end portions 125 of the gate lines 121 and the end portions 179 of the data lines 171 via the contact holes 182 and 189, respectively.

According to the second embodiment of the present invention, the data lines 171 and the ohmic contact layer patterns 163 and 165 and the semiconductor patterns 152 and 157 thereunder are formed using one mask, and the source electrode 173 and the drain electrode 175 are separated during the process. Therefore, manufacturing process becomes simple.

Although the amorphous silicon patterns 150 and 152 have a larger or smaller width than that of the data lines 171 according to the first and the second embodiment of the present invention, the amorphous silicon layers may have the same width as that of the data lines. It will be described in more detail with reference to the drawings.

Figure 17:
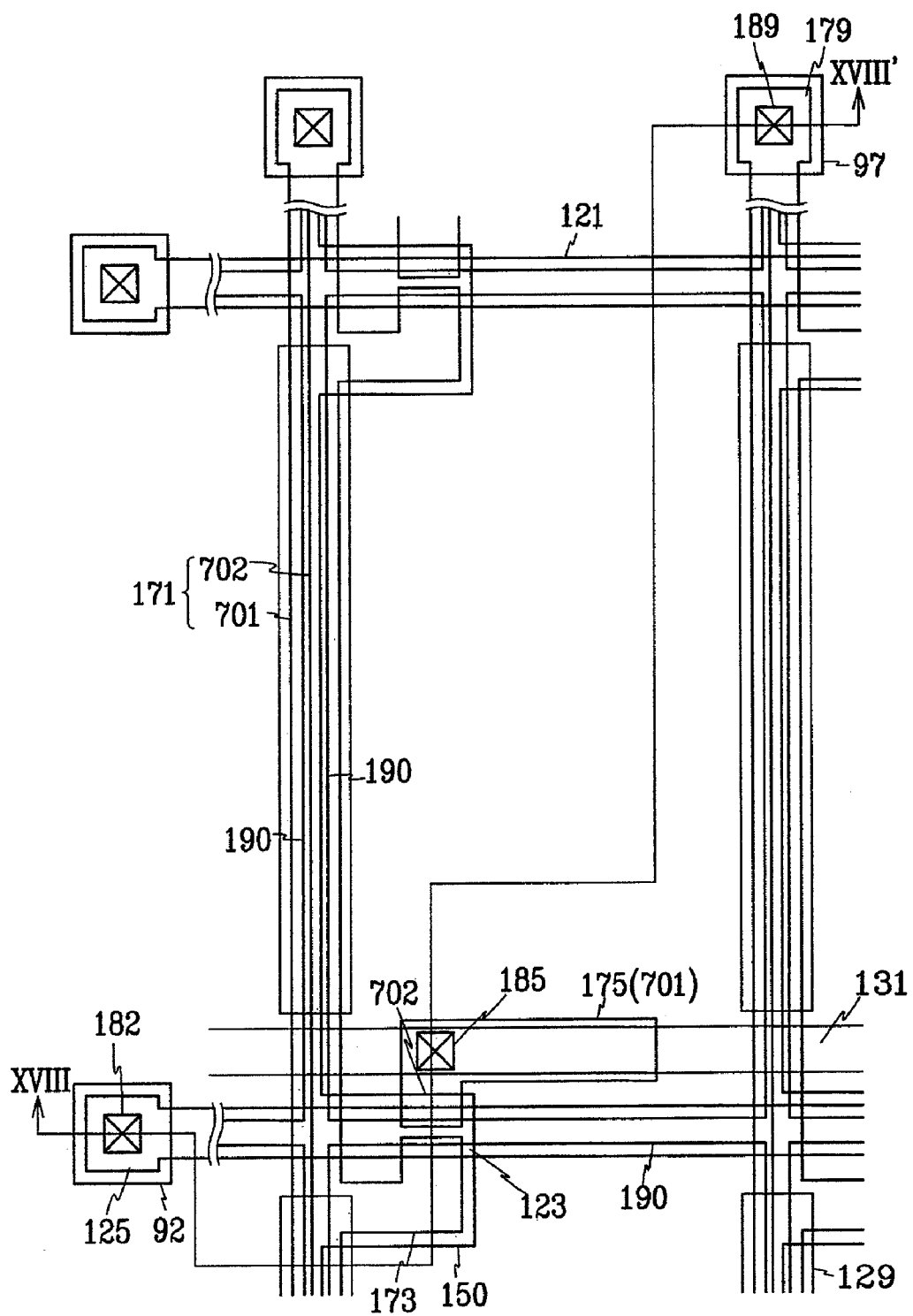
FIG. 17 is a layout view of a TFT array panel for an LCD according to a third embodiment of the present invention.
Figure 18:
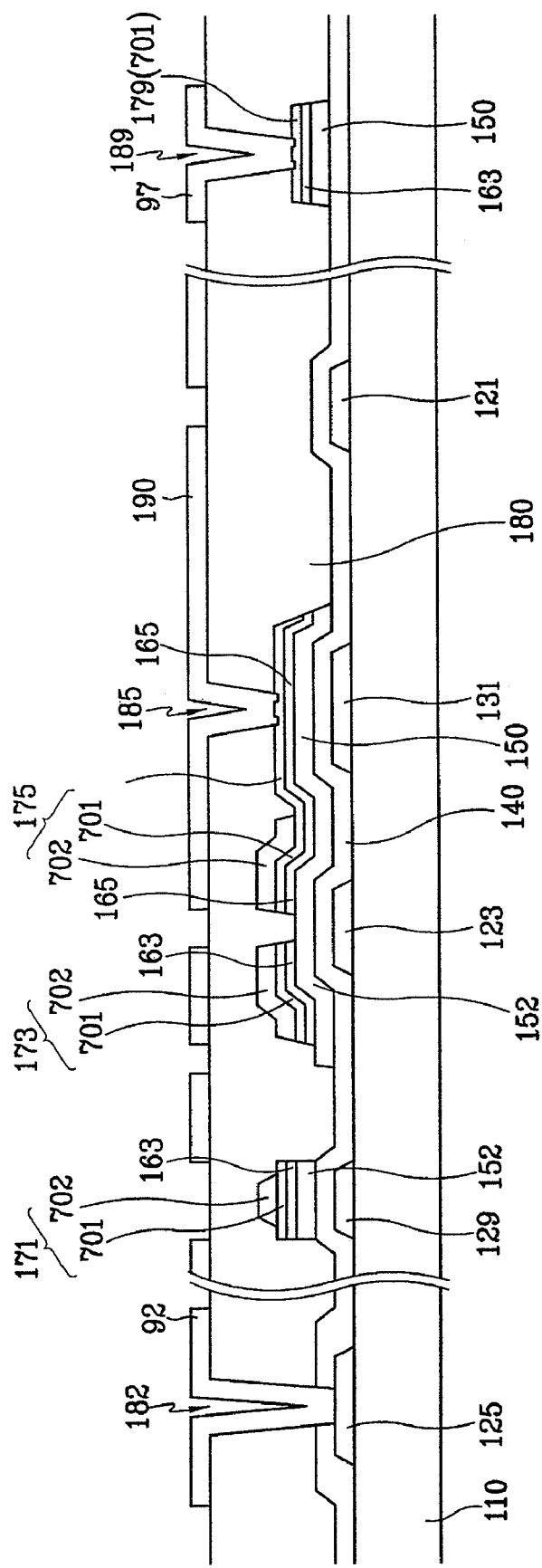
FIG. 18 is a sectional view of the TFT array panel shown in FIG. 17 taken along the line XVIII-XVIII'.

FIG. 17 is a layout view of a TFT array panel for an LCD according to a third embodiment of the present invention, and FIG. 18 is a sectional view of the TFT array panel shown in FIG. 17 taken along the line XVIII-XVIII'.

A plurality of gate lines 121, each of which including a conductive layer made of metal having low resistivity such as Ag, Ag alloy, Al, or Al alloy, and a plurality of storage electrode lines 131 receiving a common electrode voltage inputted to a common electrode of an upper panel or a gate voltage transmitted to TFTs of adjacent pixel row are formed on an insulating substrate 110 to have tapered shape having an inclination angle in a range of 30-70°. A plurality of light blocking members 129 are also formed on the substrate 110 in a substantially longitudinal direction as in the first and the second embodiments.

A plurality of semiconductor patterns 152 preferably made of a semiconductor material such as amorphous silicon and a plurality of pairs of ohmic contacts 163 and 165 are formed on the gate insulating layer 140 opposite the gate electrodes 125 to have tapered shape having an inclination angle in a range of 30-80°.

A plurality of data lines 171 and a plurality of drain electrodes 175 including a lower layer 701 made of a barrier metal such as Mo, Mo-tungsten alloy, Cr, tantalum, or titanium and an upper layer 702 made of a metal having low resistivity such as Ag, Ag alloy, Al, or Al alloy are formed on the ohmic contacts 163 and 165.

The upper layer 702 made of Al or Al alloy of the data line 171 is removed on contact portions, i.e., the drain electrode 175 and an end portion 179 of the data line, and the lower layer 701 having good contact characteristic with other materials and being made of a barrier metal to prevent Al or Al alloy from diffusing to the silicon layer is exposed on the contact portions where the upper layer 702 are removed. That is, boundary of the upper layer 702 is located on top of the lower layer 701; the data line 171 includes the lower layer 701 and the upper layer 702 having different patterns from each other.

The semiconductor pattern 152 has the same pattern as the ohmic contact layer patterns 163 and 165 except a TFT portion where the gate electrode 123, the drain electrode 175, and the source electrode 173 are located. Especially, the semiconductor pattern 152 under the data line 171 has the same width as that of the data line 171, because the semiconductor pattern 152 is patterned using the data line 171 or a photosensitive film pattern for patterning the data line 171 as an etching mask during manufacturing process.

A plurality of contact holes 185 and 189 exposing the lower layer 701 of the contact portions, i.e., the drain electrodes 171 and the end portions 179 of the data lines, respectively, are formed through a passivation layer 180 preferably made of a photosensitive organic material with good planarizability, an insulating material having low dielectric constant such as a-Si:C:O or a-Si:O:F, or silicon nitride, and a plurality of other contact holes 182 exposing the end portions 125 of the gate lines are provided in the passivation layer 180 and the gate insulating layer 140. The surface of the lower layer 701 exposed through the contact holes 185, 187, and 189 has an uneven surface having height difference. The passivation layer 180 contacts the lower layer 701 around the circumferences of the contact holes 185 and 189 and covers the lower layer 701 exposed through the contact holes 185 and 189 without having undercut shape.

A plurality of pixel electrodes 190, gate contact assistants 92, and data contact assistants 97 are formed on the passivation layer 180 as in the first and the second embodiments of the present invention, and the pixel electrodes 190 and the data contact assistants 97 are connected to respective uneven surfaces of the drain electrodes 175 and the end portions 179 of the data lines 171 via the contact holes.

The TFT array panel according to the third embodiment of the present invention also has the same advantage as the first and the second embodiment due to the light blocking member 129, and contact resistance may be assured to be low because the ITO or IZO layer 190, 92, and 97 contact only the lower layer 701 of the drain electrode 175 and the end portion 179 of the data line, which make display characteristic of the LCD improve.

Although the pixel electrode 190 is made of transparent ITO or IZO in the above embodiments, the pixel electrode may be formed using transparent conductive polymer. Alternatively, an opaque conductive material may be used for a reflection type LCD.

Then, a manufacturing method of a TFT array panel for an LCD according to the third embodiment of the present invention will be described in more detail with reference to FIGS. 17 and 18 and FIGS. 19A-23B.

Figure 19A:
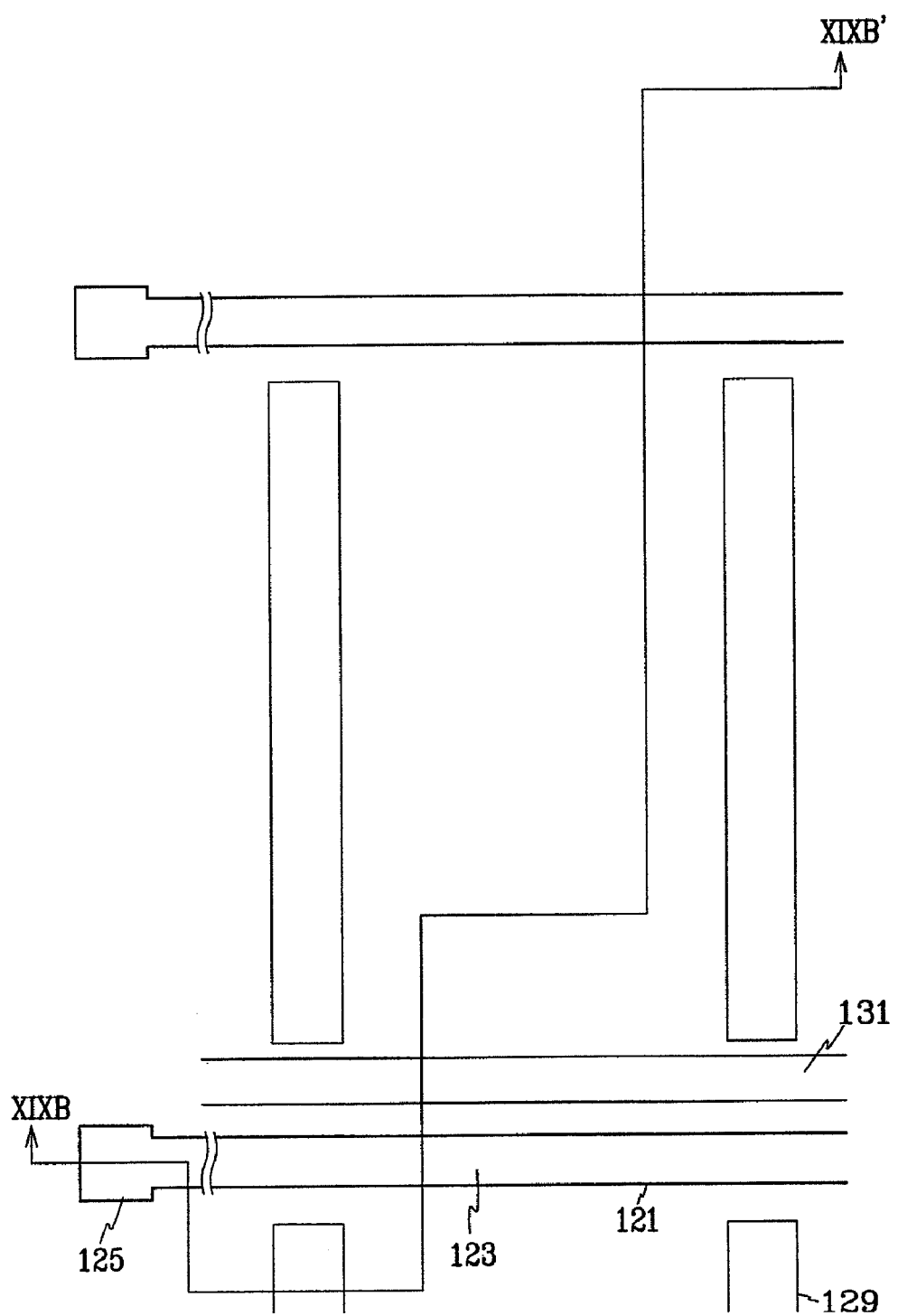
FIGS. 19A, 20A, 21A, and 23A are layout views of a TFT array panel of an LCD according to the third embodiment of the present invention in the steps of a manufacturing method.
Figure 19B:
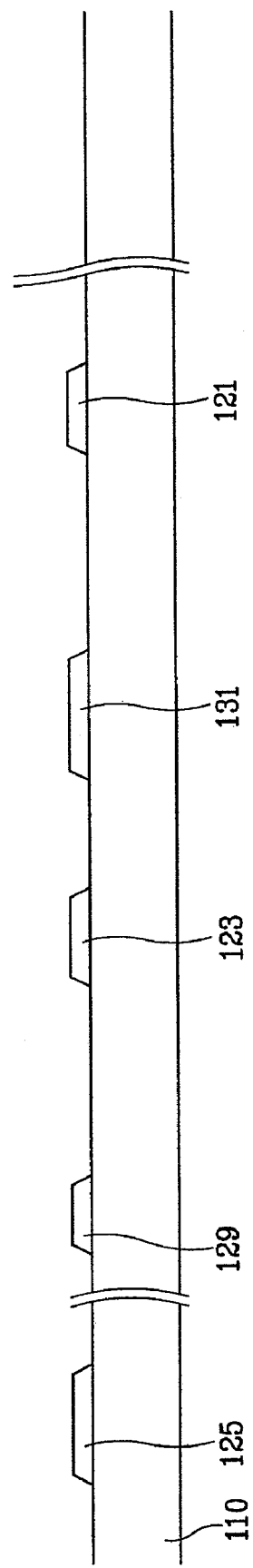
FIG. 19B is a sectional view of the TFT array panel shown in FIG. 19A taken along the line XIXB-XIXB'.

First, as shown in FIGS. 19A-19B, a gate wire including a plurality of gate lines 121 and a plurality of storage electrode lines 131 are formed on a glass substrate 110 to have tapered shape.

Figure 20A:
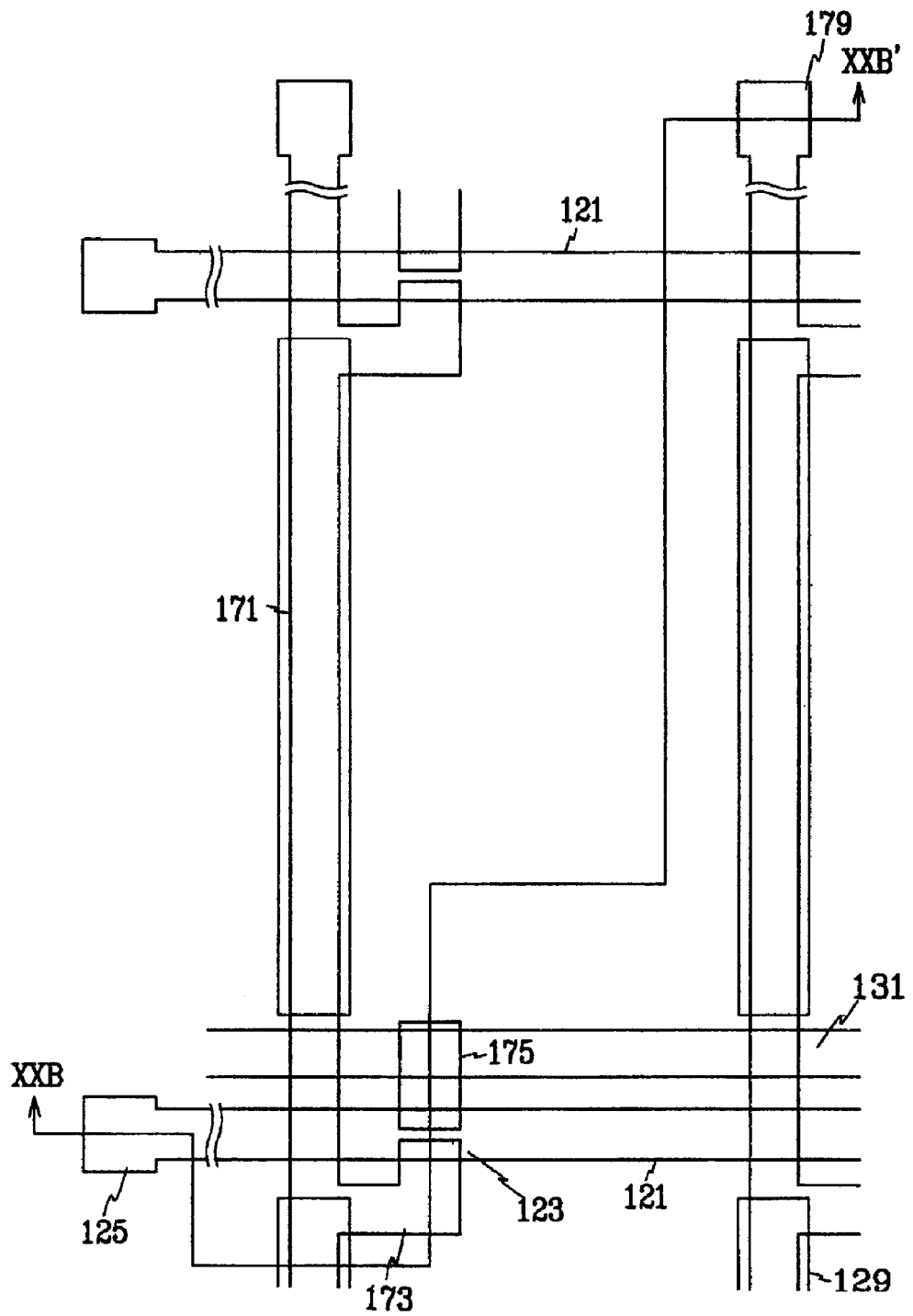
Figure 20B:
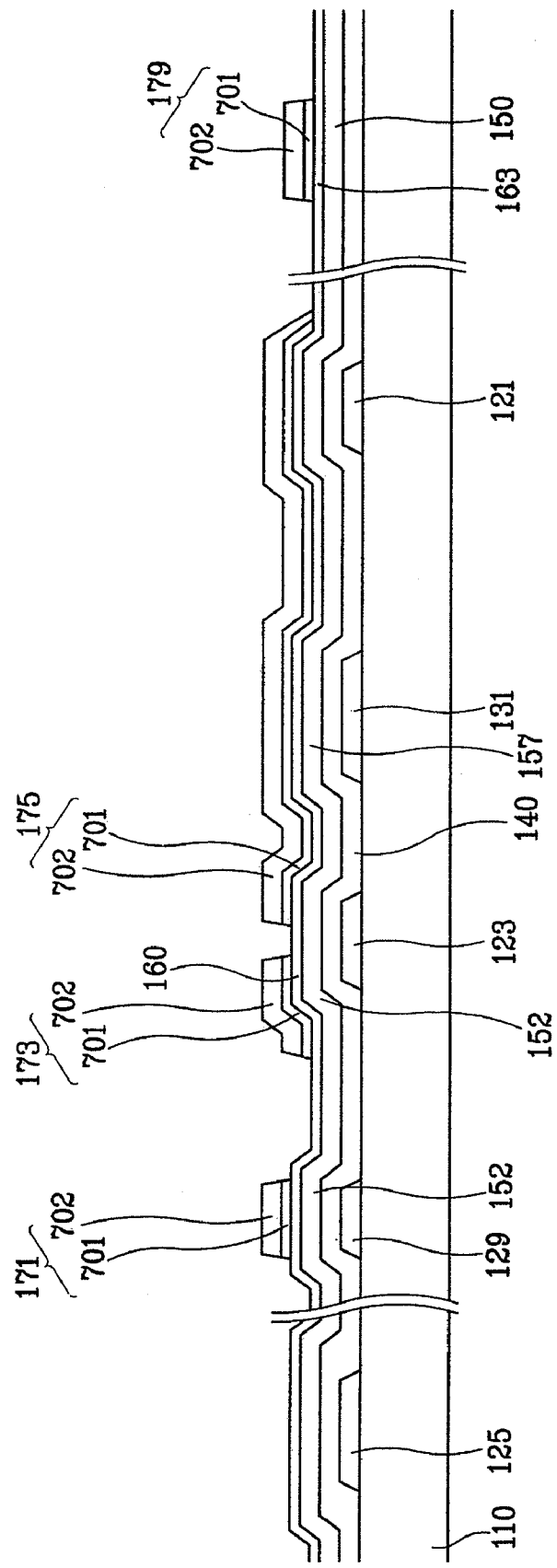
FIG. 20B is a sectional view of the TFT array panel shown in FIG. 20A taken along the line XXB-XXB', which is the next step of FIG. 19B.

Next, as shown in FIGS. 20A and 20B, triple layers of a gate insulating layer, a semiconductor layer 150 preferably made of amorphous silicon, and a doped amorphous silicon layer 160 are deposited in sequence. Preferably, the gate insulating layer 140 is formed by deposition of silicon nitride with thickness of 2,000-5,000 Å at the temperature range of 250-400° C. Subsequently, a lower layer 701 made of a barrier metal being able to prevent other materials from diffusing to the semiconductor layer 150 or the doped amorphous silicon layer 160 and having good contact characteristic with other materials such ITO or IZO as well is formed to have thickness of 500 Å, and an upper layer 702 is sputtered using a target of Al or Al alloy such as Al—Nd including 1 at % of Nd having low resistivity to have thickness of 150-2,500 Å. Then, the upper layer 702 and the lower layer 701 are patterned through photolithography using a photo mask for data wire to form a plurality of data lines 171 and a plurality of drain electrodes 175. Both the upper layer 702 and the lower layer 701 may be wet etched. Alternatively, the upper layer 702 is wet etched while the lower layer 701 is dry etched. If the lower layer is made of Mo or Mo alloy, the lower layer 701 and the upper layer 702 may be patterned using one etching condition.

Figure 21A:
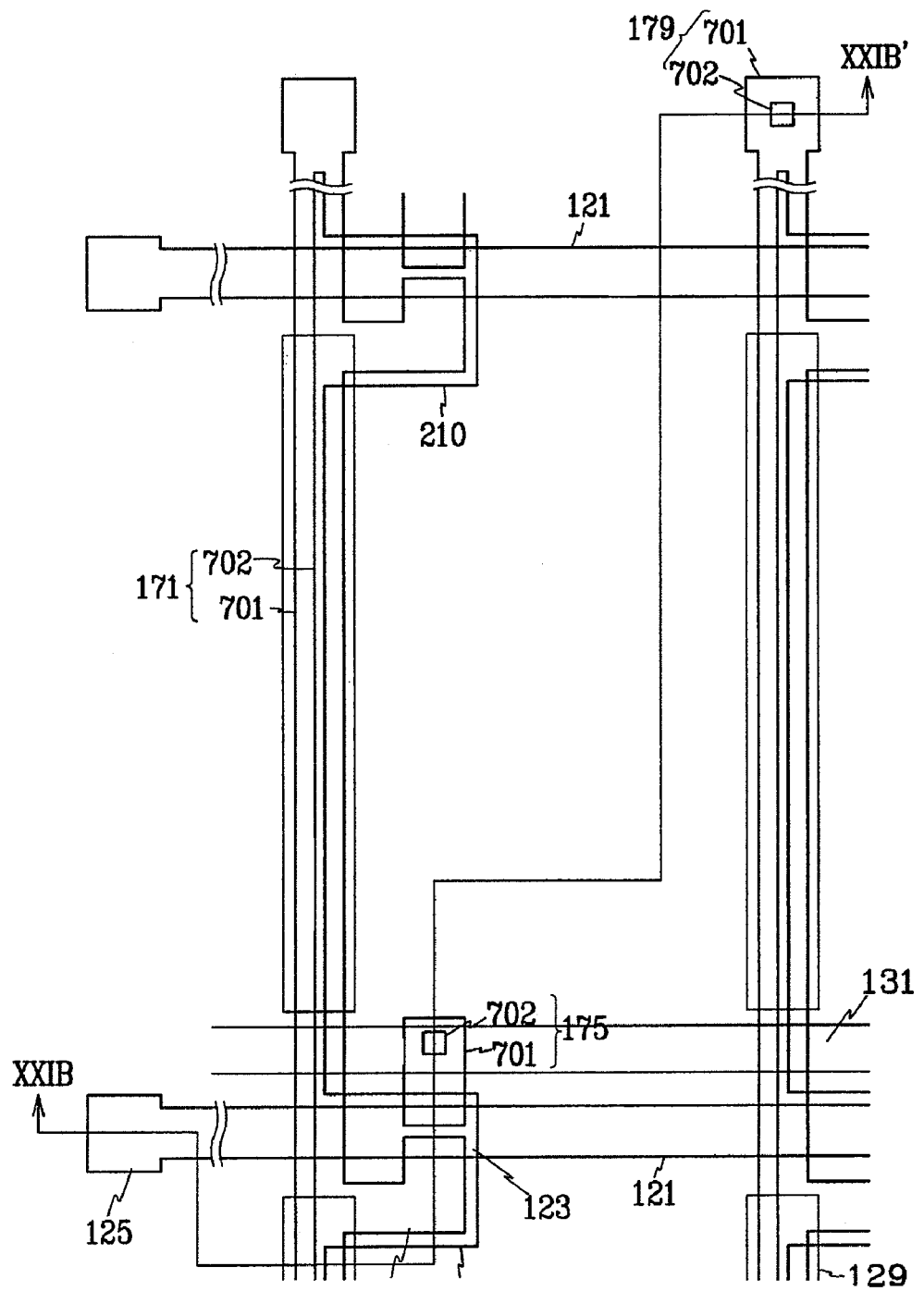
Figure 21B:
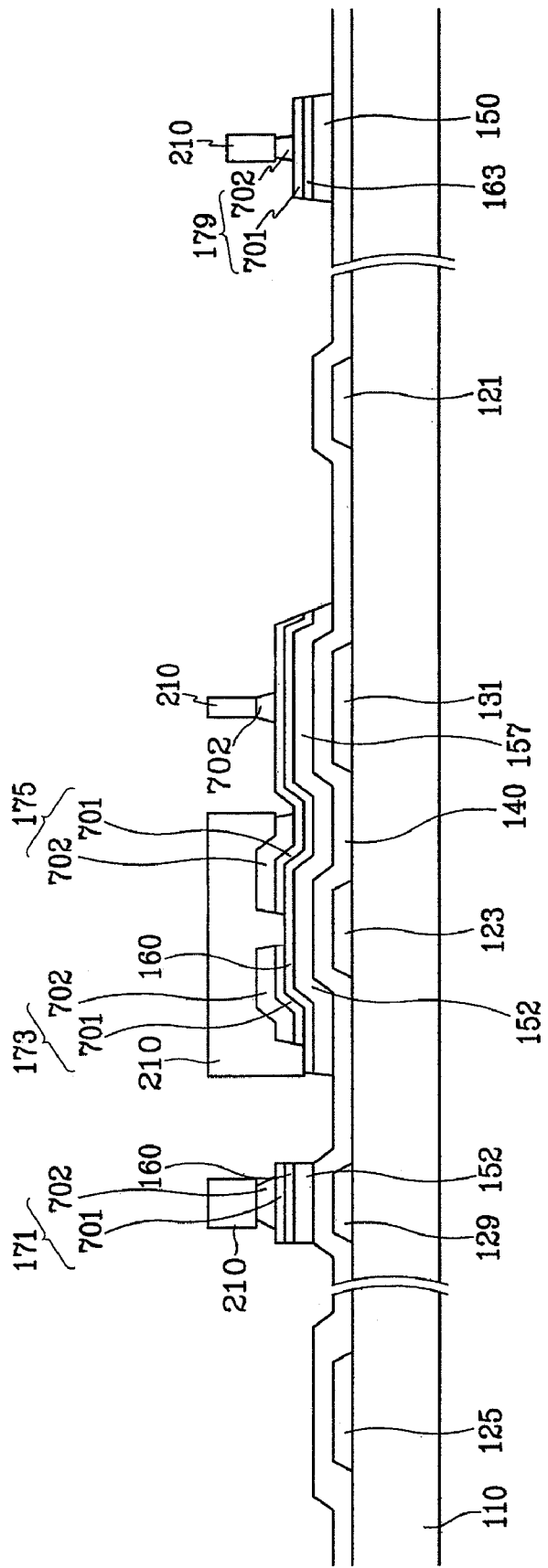
FIG. 21B is a sectional view of the TFT array panel shown in FIG. 21A taken along the line XXIB-XXIB', which is the next step of FIG. 20B.

Succeedingly, as shown in FIGS. 21A and 21B, a photosensitive film pattern 210 for semiconductor pattern is formed through photolithography using a photo mask for semiconductor pattern. The photosensitive film pattern 210 should be formed not to cover the end portion 179 of the data line 171 and the drain electrode 175 of the data wire, which are used as contact portions. Next, the upper layer 702 including Al is etched using the photosensitive film pattern 210 as an etching mask to expose the lower layer 701 of the contact portions, i.e., the end portion 179 of the data line 171 and the drain electrode 175. A part of the photosensitive film pattern 210 is preferably remained on the end portion 179 of the data line and the drain electrode 175, which are used as the contact portions, to let the upper layer 702 remain on the contact portions exposed through the contact holes 185, 187, and 189, which will be formed later. It is to protect the surface of the lower layer 701 from damage; otherwise, the lower layer 701 is entirely exposed on the contact portions during dry etching process thereafter and might be damaged. Preferably, the upper layer 702 remained on the contact portions of the end portion 179 of the data line and the drain electrode 175 is smaller than the contact holes 185 and 189 in the passivation layer 180, which will be formed later, and has island shape. Then, the exposed doped amorphous silicon layer 160 and the semiconductor layer 150 are etched using the data line 171, the drain electrode 175, and the photosensitive film pattern 210 as an etching mask to complete the semiconductor pattern 152 and remain the doped amorphous silicon layer 160 thereon. Since the semiconductor pattern 152 remains in the portions under the data line 171 and the drain electrode 175 and the portion which is not covered with the photosensitive film pattern 210, the semiconductor pattern 152 has a larger area than those of the data line 171 and the drain electrode 175, On the other hand, since the photosensitive film pattern 210 is used as an etching mask to remove the upper layer 702 including Al on the contact portions, the photosensitive film pattern 210 does not cover at least the end portion 179 of the data line and a part of the drain electrode 175, which are a part of the data wire, and covers at least the channel portion between the source electrode 173 and the drain electrode 175 to prevent the semiconductor pattern from etching.

Although the data line 171 and the drain electrode 175 are formed to have double-layered structure, they might be formed to have a single layer. In addition, the photosensitive film pattern 210 may be formed to completely cover the data line 171.

Subsequently, the photosensitive film pattern 210 is removed, and the doped amorphous silicon layer pattern 160 which is not covered with the data line 171 or the drain electrode 175 is etched to divide it into two portions with respect to the gate electrode while exposing the semiconductor pattern 152 between the two doped amorphous silicon layers 163 and 165. The doped amorphous silicon layer pattern 160 is dry etched. Since the lower layer 701 might be entirely damaged if the lower layer 701 of the contact portions of the end portion 179 of the data line 171 and the drain electrode 175 are exposed completely, dry etching is performed after remaining the upper layer 702 on the contact portions of the end portion 179 of the data line and the drain electrode 175 as described above.

Figure 23A:
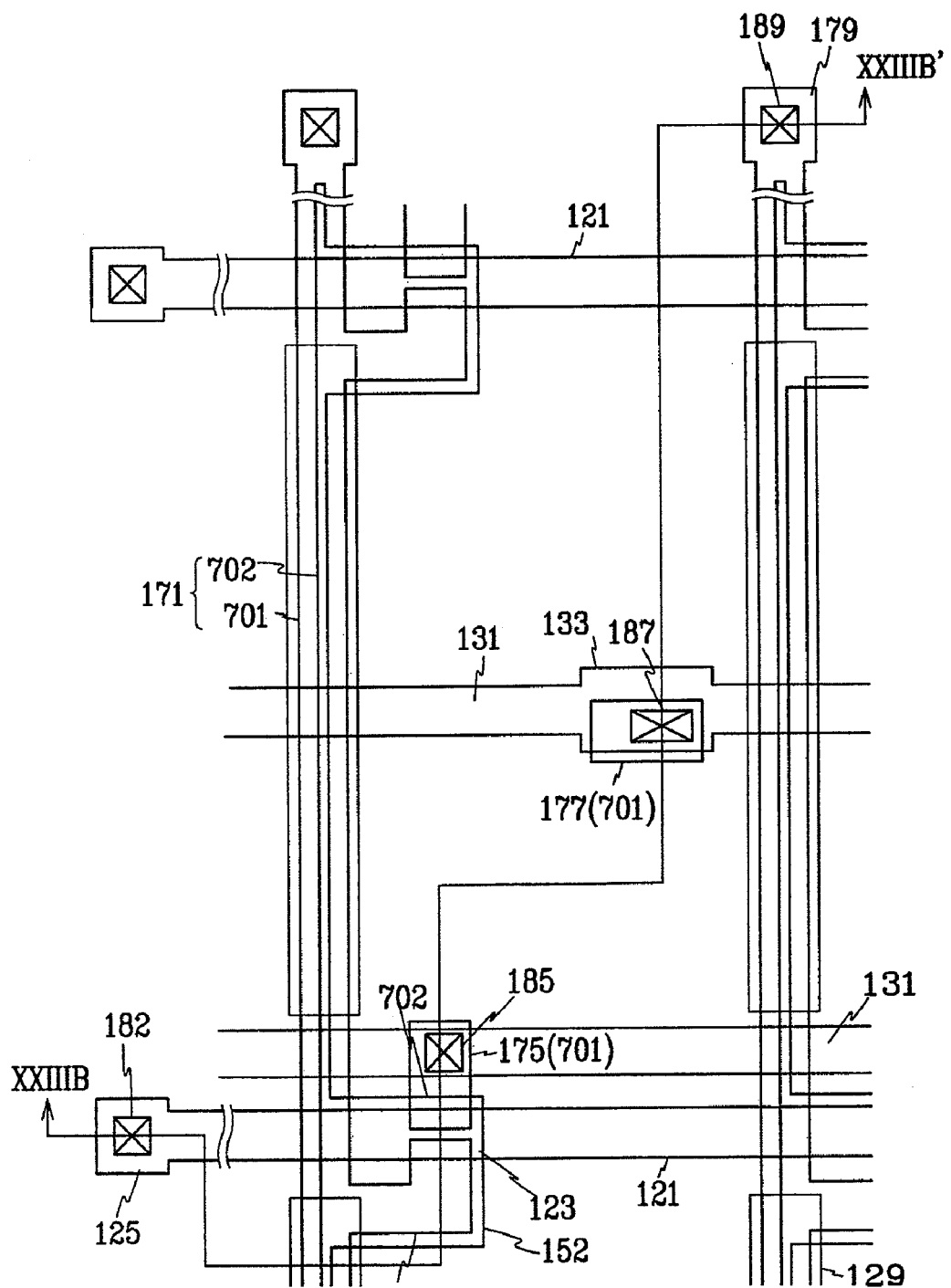
Figure 23B:
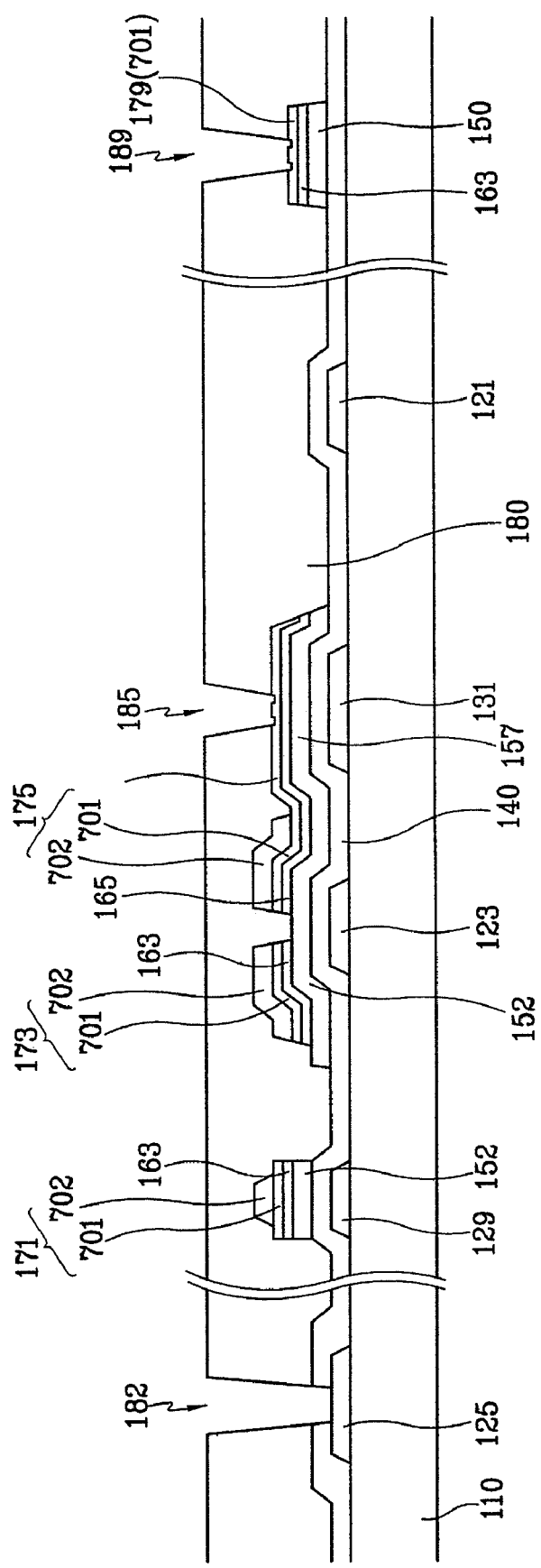
FIG. 23B is a sectional view of the TFT array panel shown in FIG. 23A taken along the line XXIIIB-XXIIIB', which is the next step of FIG. 22.

Next, as shown in FIGS. 23A and 23B, a passivation layer 180 is formed and patterned together with the gate insulating layer 140 through dry etching to form a plurality of contact holes 182, 185, and 189 exposing the lower layer 701 of end portions 125 of the gate lines 121, the drain electrodes 175, and end portions 179 of the data lines 171, respectively. Since the exposed lower layer 701 on the contact portions of the end portion 179 of the data line and the drain electrode 175 through the contact holes 185 and 189, which is not covered with the upper layer 702, is partly etched during dry etching of the passivation layer 180 while the portion covered with the upper layer 702 is not etched, the lower layer 701 has an uneven surface having height difference on the contact portions.

Succeedingly, the upper layer 702 made of Al or Al alloy, which is exposed through the contact holes 185 and 189, is etched to be removed. Finally, as shown in FIGS. 17 and 18, a plurality of pixel electrodes 190 connected to the associated drain electrodes 175 via contact holes 185 and a plurality of gate contact assistants 92 and a plurality of data contact assistants 97 connected to the end portions 125 of the gate lines 121 and the end portions 179 of the data lines 171 via the contact holes 182 and 189, respectively, are formed. In this embodiment of the present invention, IDIXO (indium x-metal oxide) of Idemitsu Corporation is used as a target for forming the IZO layer 190, 92, and 97. The target includes $In_2O_8$ and ZnO, and percentage of Zn of In+Zn is preferably 15-20 at %. To minimize contact resistance, the IZO layer is deposited to have a thickness equal to or less than 250 Å.

On the other hand, a photosensitive film pattern 210 for semiconductor pattern may be formed to have a larger width than that of the data line 171 in the manufacturing method according to the third embodiment of the present invention, and a structure completed through this manufacturing method is described in detail with reference to the drawings.

Figure 24:
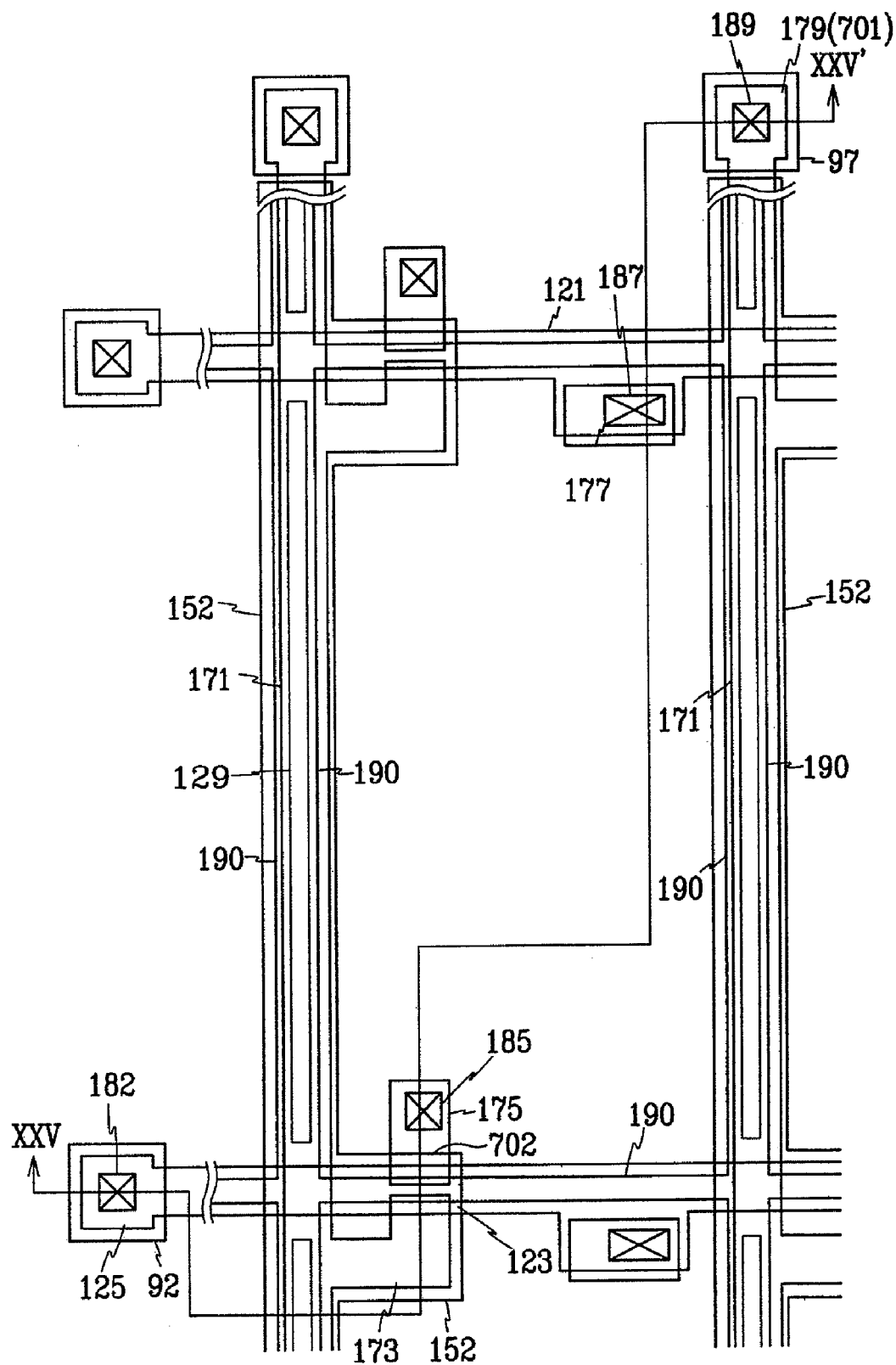
FIG. 24 is a layout view of a TFT array panel for an LCD according to a fourth embodiment of the present invention.
Figure 25:
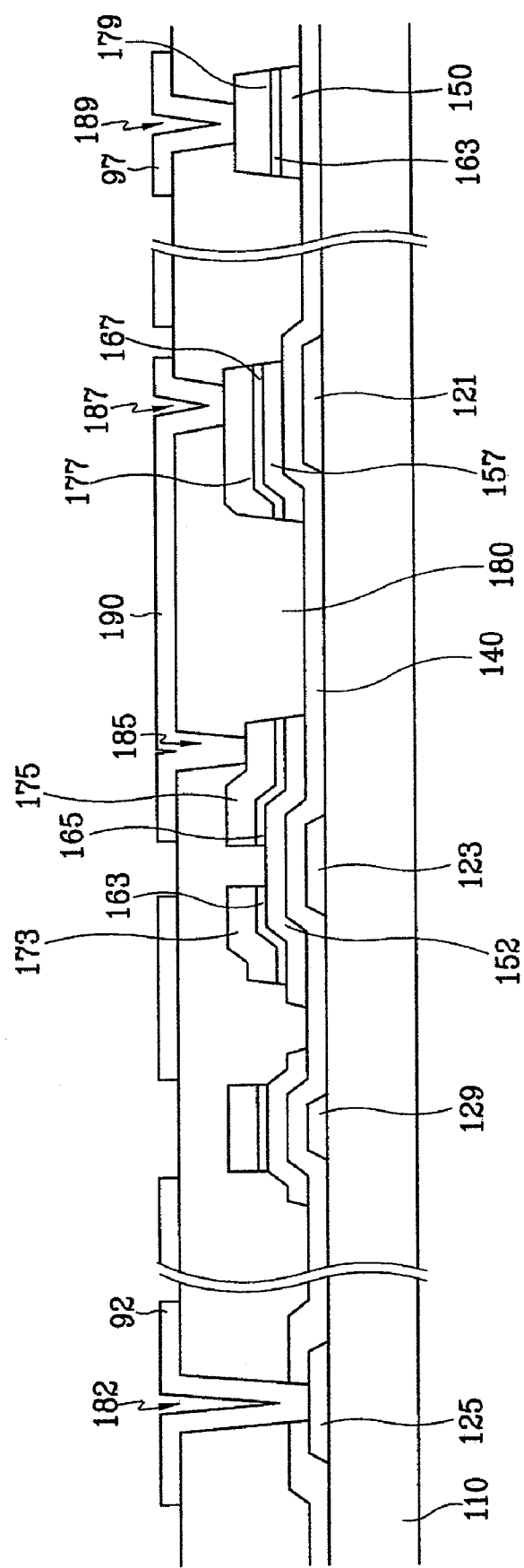
FIG. 25 is a sectional view of the TFT array panel shown in FIG. 24 taken along the line XXV-XXV'.

FIG. 24 is a layout view of a TFT array panel for an LCD according to a fourth embodiment of the present invention, and FIG. 25 is a sectional view of the TFT array panel shown in FIG. 24 taken along the line XXV-XXV'.

As shown in FIGS. 24 and 25, the structure is very similar to that of the third embodiment of the present invention.

However, the semiconductor pattern 152 has a larger width than that of the data line 171, and the upper layer 702 including Al is formed entirely on the data line 171. The light blocking member 129 is formed to have a smaller width than that of the data line 171.

On the other hand, light blocking members of the first through fourth embodiments of the present invention can be applied to a TFT array panel for an IPS (in-plane switching) type LCD in which liquid crystal molecules arranged parallel to panels are controlled by pixel electrodes and common electrodes arranged linearly on a same panel.

Figure 26:
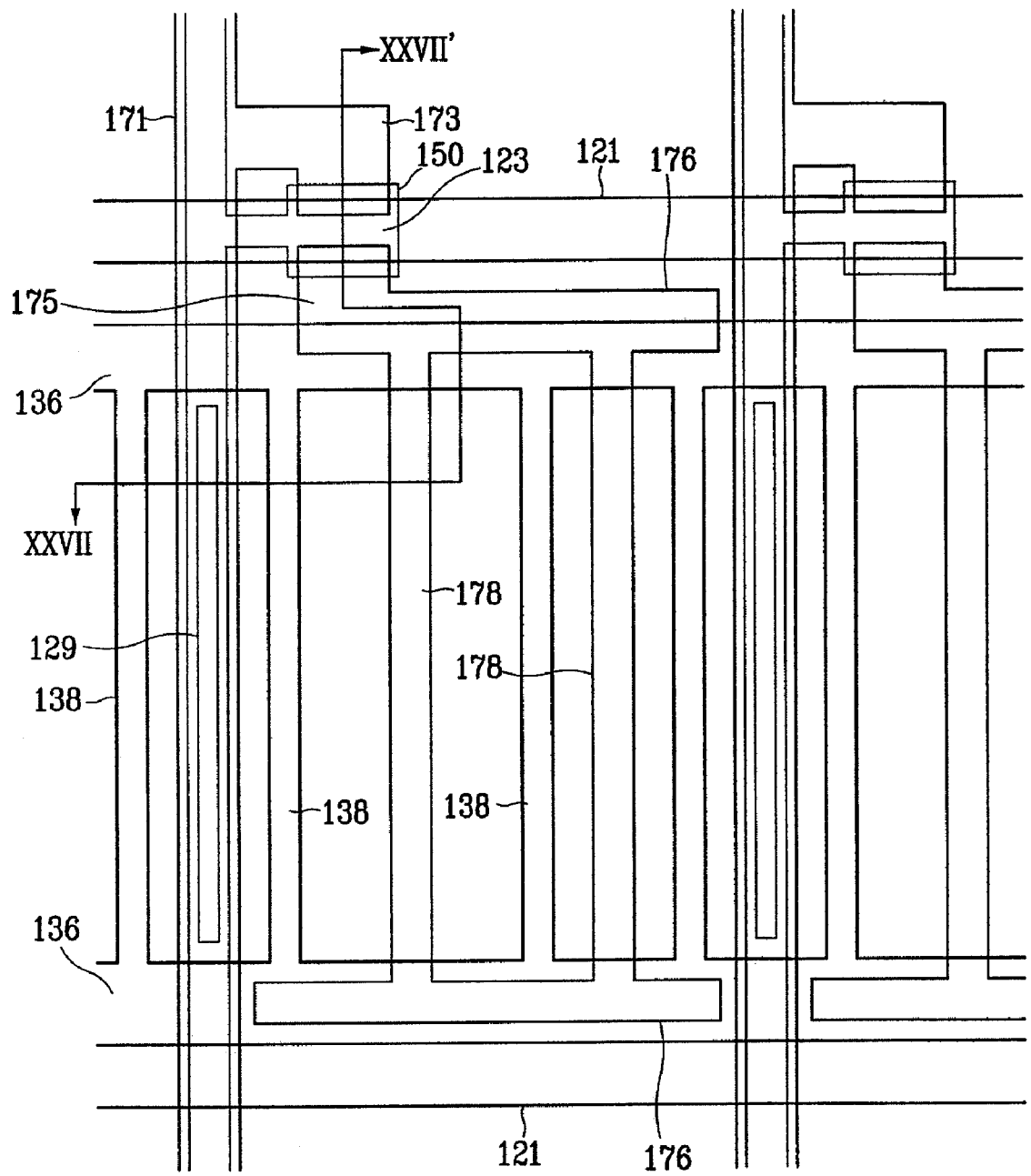
FIG. 26 is a layout view of a TFT array panel for an LCD according to a fifth embodiment of the present invention.
Figure 27:
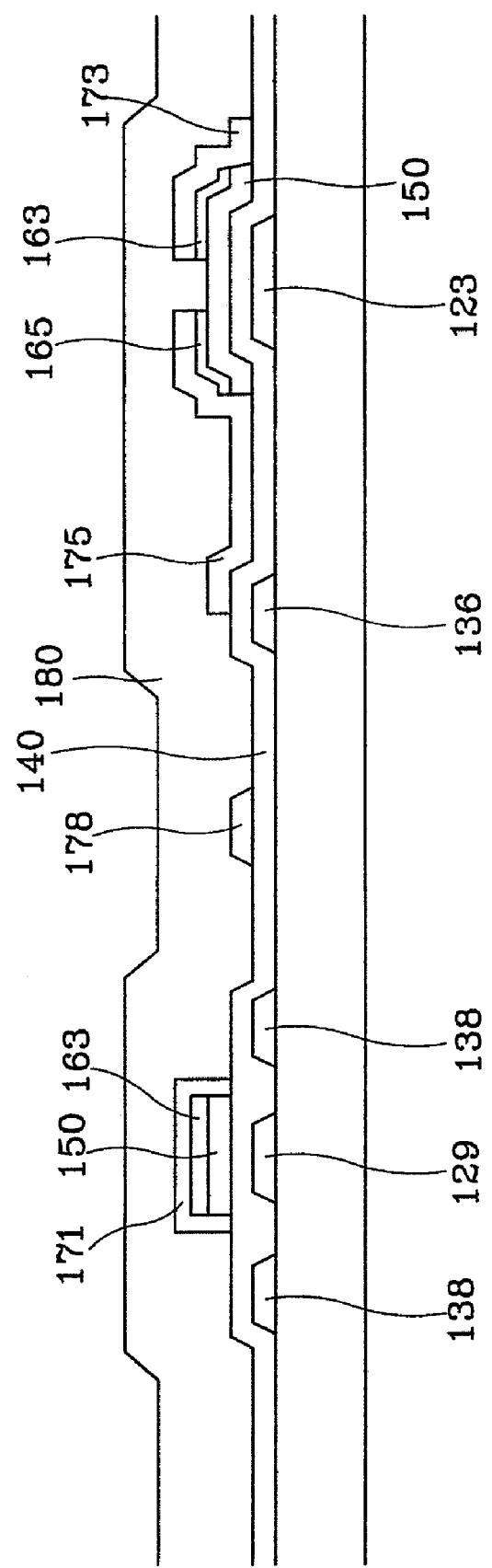
FIG. 27 is a sectional view of the TFT array panel shown in FIG. 26 taken along the line XXVII-XXVII'.
Figure 28:
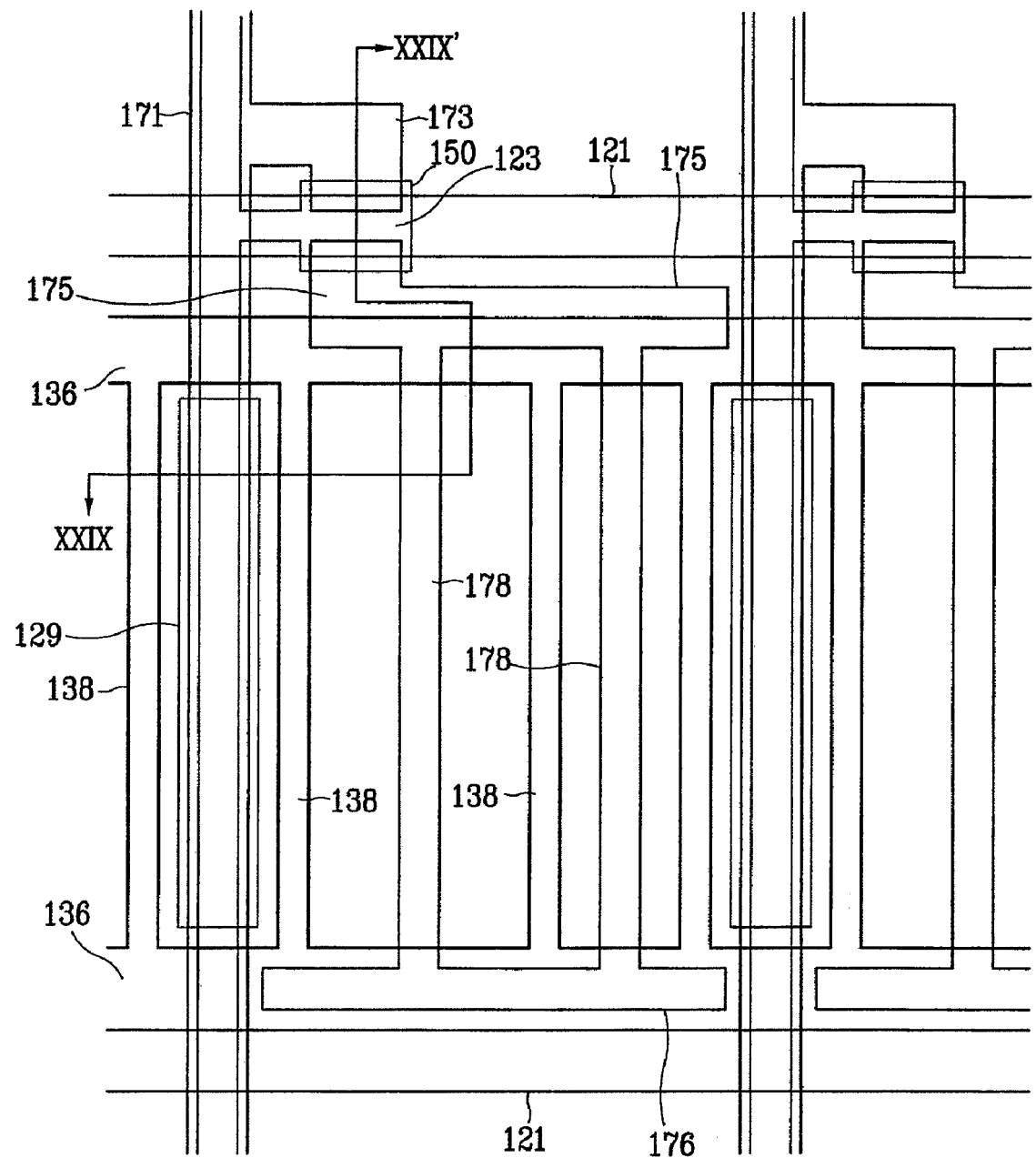
FIG. 28 is a layout view of a TFT array panel for an LCD according to a sixth embodiment of the present invention.
Figure 29:
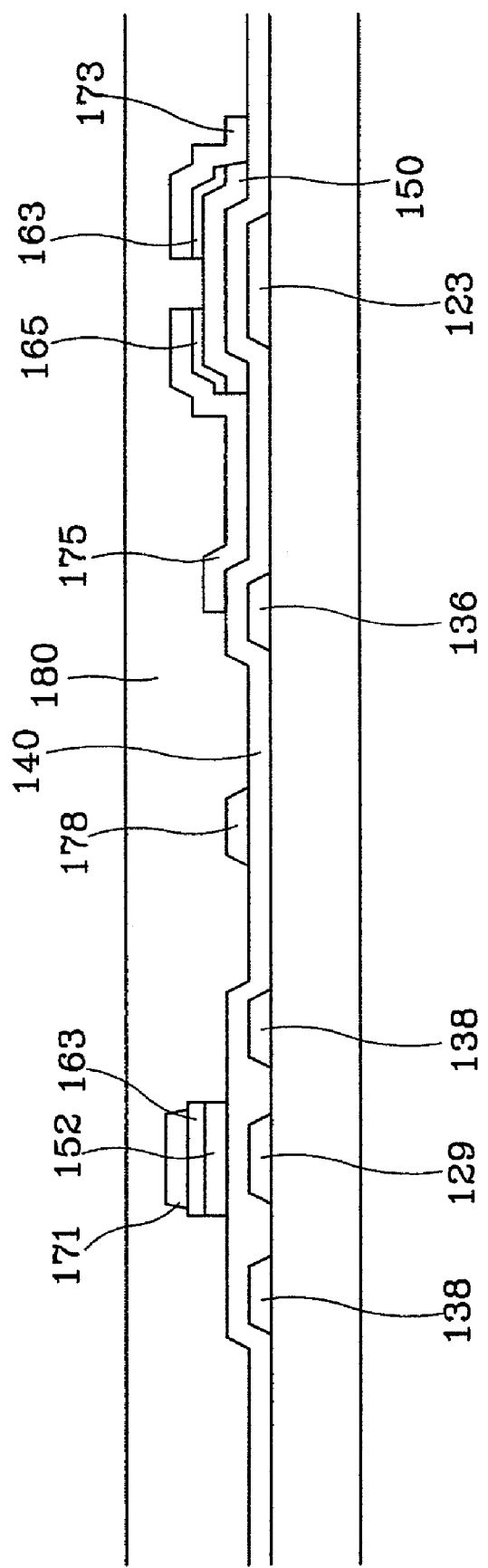
FIG. 29 is a sectional view of the TFT array panel shown in FIG. 28 taken along the line XXIX-XXIX'.

FIG. 26 is a layout view of a TFT array panel for an LCD according to a fifth embodiment of the present invention, FIG. 27 is a sectional view of the TFT array panel shown in FIG. 26 taken along the line XXVII-XXVII', FIG. 28 is a layout view of a TFT array panel for an LCD according to a sixth embodiment of the present invention, and FIG. 29 is a sectional view of the TFT array panel shown in FIG. 28 taken along the line XXIX-XXIX'.

As shown in FIGS. 26 and 27, a plurality of gate lines 121 and a common wire are formed on an insulating substrate 110. The common wire includes a plurality of common signal lines 136 extending substantially in a transverse direction parallel to the gate lines 121 and a plurality of common electrodes 138 connected to the common signal lines 136 and receiving a common signal via the common signal lines 136. The common wire 136 and 138 might overlap pixel wire 176 and 178, which will be formed later, to serve as storage electrodes for forming storage capacitance. A plurality of light blocking members 129 overlapping semiconductor patterns 150 under data lines 171, which will be formed later, extend substantially in a longitudinal direction.

A plurality of semiconductor patterns 150 extending substantially in a longitudinal direction along data lines, which will be formed later, are formed on a gate insulating layer 140 covering the gate lines 121 and the common wire 136 and 138. A part of each semiconductor pattern 150 overlaps the light blocking member 129. A plurality of pairs of ohmic contacts 163 and 165 are formed on the semiconductor patterns 150.

A plurality of data lines 171 and a plurality of drain electrodes 175 are formed on the gate insulating layer 140 or on the ohmic contacts 163 and 165. In addition, a pixel wire including a plurality of pixel signal lines 176 extending substantially in a transverse direction, forming storage capacitors by facing or overlapping the common signal lines 136, and being connected to the associated drain electrodes 175 and a plurality of pixel electrodes 178 extending substantially in a longitudinal direction to face the common electrodes parallel and being connected to the pixel electrode lines 176 is formed in the same layer as the data line 171.

A passivation layer 180 is formed over the substrate 110. A plurality of contact holes exposing end portions of the gate lines and the data lines may be formed in the passivation layer 180 as in the first through fourth embodiments. A plurality of auxiliary data lines connected to the associated data lines 171 may be formed on the passivation layer, and contact assistants electrically connected to end portions of the gate lines and the data lines may also be formed.

A TFT array panel according to a sixth embodiment of the present invention is similar to that of the fifth embodiment.

However, the semiconductor pattern 152 except the channel portion has the same pattern as the data line 171 and the drain electrode 175.

Although pixel wire 176 and 178 are located in the same layer as the data line 171 and the drain electrode 175 according to the fifth and sixth embodiments, it may be formed in the same layer as the gate line 121 or on the passivation layer 180. Common wire 136 and 138 may be formed in a different layer from the gate line 121 or in the same layer as the pixel wire 176 and 178.

Color filters of red, green, and blue are usually formed on an opposing panel; however, they might be formed on a TFT array panel. It will be described in detail with reference to the drawings.

Figure 30:
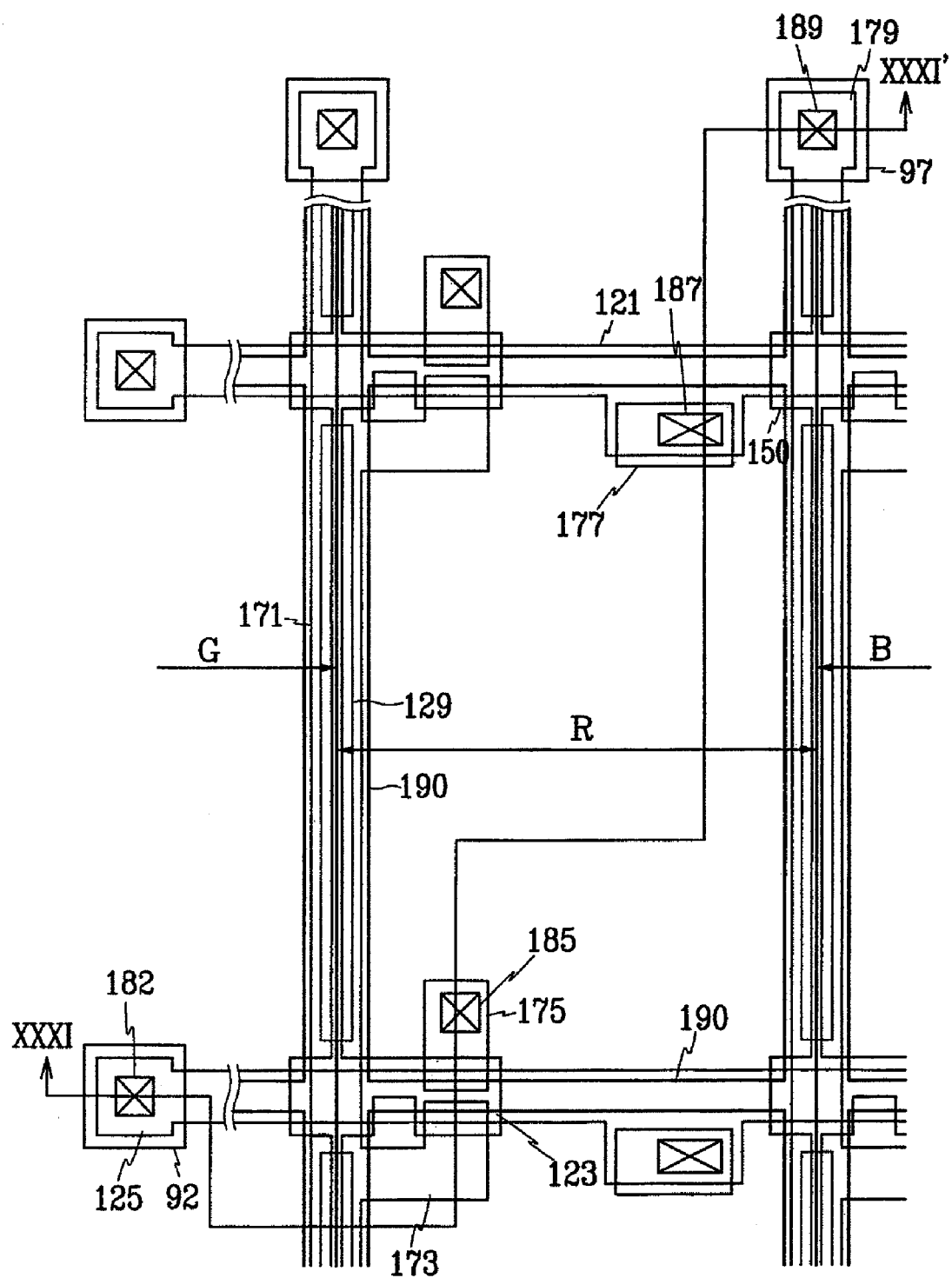
FIG. 30 is a layout view of a TFT array panel for an LCD according to a seventh embodiment of the present invention.
Figure 31:
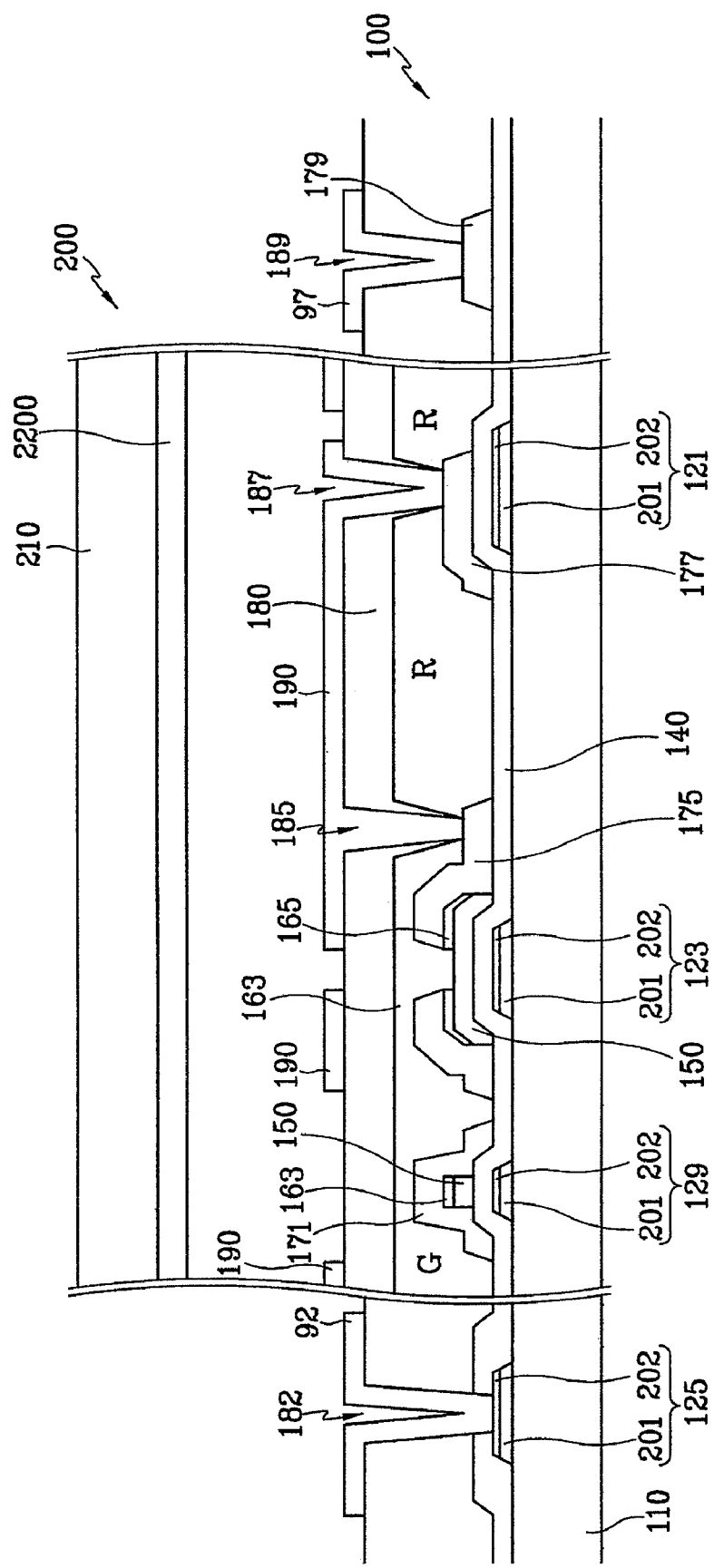
FIG. 31 is a sectional view of the TFT array panel shown in FIG. 30 taken along the line XXXI-XXXI'.

FIG. 30 is a layout view of a TFT array panel for an LCD according to a seventh embodiment of the present invention, and FIG. 31 is a sectional view of the TFT array panel shown in FIG. 30 taken along the line XXXI-XXXI'.

As shown in FIGS. 30 and 31, a TFT array panel according to the seventh embodiment of the present invention is similar to that shown in FIGS. 1 and 2.

However, red (R), green (G), and blue (B) color filters are formed on the pixel electrode 190 and under the passivation layer 180 on the TFT array panel according to the seventh embodiment of the present invention.

Contact holes formed in R, G, and B color filters may be larger or smaller than those 185 and 187 formed in the passivation layer 180, which make the sidewall of the contact holes 185 and 187 have terraced shape. Preferably, sidewalls defining the contact holes have tapered shape.

The R, G, and B color filters may be arranged between the gate lines 121 and the substrate 110, and they may overlap each other at the edges overlapping the data lines 171.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

As shown in the above, since an LCD including the TFT array panel according to the present invention is provided with the light blocking member for shielding light incident on the amorphous silicon layer under the data line from the backlight, display characteristic of the LCD is improved. Especially for an LCD using a backlight driven by an inverter, stripes of different brightness and waterfall phenomenon in which the stripes move up and down when it displays an image can be removed.

What is claimed is

1. A thin film transistor array panel comprising:
   a substrate;
   a gate wire formed on the substrate and including a gate line and a gate electrode connected to the gate line;
   a gate insulating layer formed on the gate wire;
   a data wire including a data line crossing the gate line, a source electrode connected to the data line, and a drain electrode facing the source electrode with reference to the gate electrode;
   a semiconductor pattern formed on the gate insulating layer and including a first portion located under the data line between two neighboring gate wires and a second portion located under the source electrode and the drain electrode;
   a light blocking member overlapping the first portion of the semiconductor pattern, wherein the light blocking member is formed of the same layer as the gate wire and separate from the gate wire; and
   a pixel electrode electrically connected to the drain electrode,
   wherein a planar shape of the top surface of the first portion and the second portion is substantially the same as a planar shape of the bottom surface of the data wire, and
   wherein a width of the light blocking member is smaller than a width of the semiconductor pattern.

2. The thin film transistor array panel of claim 1, wherein a width of the data line is equal to or smaller than a width of the semiconductor pattern overlapping the data line.

3. The thin film transistor array panel of claim 1, wherein the semiconductor pattern has substantially the same planar shape as the data wire except for a channel portion located between the source electrode and the drain electrode.

4. The thin film transistor array panel of claim 3, wherein a part of the semiconductor pattern stretches out from an edge of the data wire.

5. The thin film transistor array panel of claim 1, wherein the data wire includes a lower layer and an upper layer formed on the lower layer and having a different shape from the lower layer.

6. The thin film transistor array panel of claim 1, wherein the light blocking member is a multi-layered structure comprising at least two layers of different conductive materials.

7. The thin film transistor array panel of claim 6, wherein the different conductive materials include Al and Cr.

8. The thin film transistor array panel of claim 6, wherein the multi-layered structure has tapered sidewalls.

9. The thin film transistor array panel of claim 8, wherein the tapered sidewalls have an angle of inclination about 60 degrees to about 80 degrees.

10. The thin film transistor array panel of claim 1, wherein a width of the light blocking member is smaller than a width of the data wire.

* * * * *